US00RE43231E

(19) United States
(12) Reissued Patent
Sayood et al.

(10) Patent Number: US RE43,231 E
(45) Date of Reissued Patent: Mar. 6, 2012

(54) SYSTEM AND METHOD FOR JOINT SOURCE-CHANNEL ENCODING, WITH SYMBOL, DECODING AND ERROR CORRECTION

(75) Inventors: Khalid Sayood, Lincoln, NE (US); Michael W. Hoffman, Lincoln, NE (US); Billy D. Pettijohn, Mountain View, CA (US)

(73) Assignee: Board of Regents of the University of Nebraska, Lincoln, NE (US)

(21) Appl. No.: 11/798,175

(22) Filed: May 10, 2007

Related U.S. Patent Documents

Reissue of:
(64) Patent No.: 6,892,343
Issued: May 10, 2005
Appl. No.: 09/816,398
Filed: Mar. 24, 2001

U.S. Applications:
(60) Provisional application No. 60/192,215, filed on Mar. 27, 2000.

(51) Int. Cl.
*H03M 13/25* (2006.01)
*H03M 13/01* (2006.01)

(52) U.S. Cl. ..... 714/779; 714/752; 714/786; 380/200; 370/277

(58) Field of Classification Search ..... None
See application file for complete search history.

(56) References Cited

U.S. PATENT DOCUMENTS

| | | | | |
|---|---|---|---|---|
| 3,602,886 | A * | 8/1971 | Carter et al. | 714/816 |
| 4,286,256 | A | 8/1981 | Langdon, Jr. et al. | |
| 4,295,125 | A | 10/1981 | Langdon, Jr. | |
| 4,862,464 | A | 8/1989 | Betts et al. | |
| 5,097,151 | A | 3/1992 | Eerenstein et al. | |
| 5,200,962 | A | 4/1993 | Kao et al. | |
| 5,206,864 | A | 4/1993 | McConnell | |
| 5,233,629 | A | 8/1993 | Paik et al. | |
| 5,311,177 | A | 5/1994 | Kimura et al. | |
| 5,317,428 | A | 5/1994 | Osawa et al. | |
| 5,418,863 | A | 5/1995 | Ando | |
| 5,517,511 | A | 5/1996 | Hardwick et al. | |
| 5,587,710 | A | 12/1996 | Choo et al. | |
| 5,708,510 | A | 1/1998 | Maruyama et al. | |
| 5,710,826 | A | 1/1998 | Osawa et al. | |
| 5,715,332 | A | 2/1998 | Nakanishi | |
| 5,745,504 | A | 4/1998 | Bang | |

(Continued)

FOREIGN PATENT DOCUMENTS

| | | | |
|---|---|---|---|
| JP | 63215226 A | * | 9/1988 |
| JP | 63215226 A | | 9/1998 |

OTHER PUBLICATIONS

Boyd et al., "Integrating Error Detection into Arithmetic Coding", IEEE Transactions on Communications, 45(1), p. 1-3, (Jan. 1997).

(Continued)

*Primary Examiner* — Jeffrey A Gaffin
*Assistant Examiner* — Dipakkumar Gandhi

(57) ABSTRACT

[Disclosed is a] *A* system and method for joint source-channel encoding, symbol decoding and error correction, preferably utilizing an arithmetic encoder with operational error detection space; and a combination sequential, and arithmetic, encoded symbol decoder structure.

58 Claims, 7 Drawing Sheets

U.S. PATENT DOCUMENTS

| | | | | |
|---|---|---|---|---|
| 5,774,081 | A | 6/1998 | Cheng et al. | |
| 5,841,794 | A | 11/1998 | Inoue et al. | |
| 5,870,405 | A | 2/1999 | Hardwick et al. | |
| 5,894,486 | A * | 4/1999 | Katsube | 714/809 |
| 5,910,967 | A | 6/1999 | Vanderaar | |
| 5,983,382 | A | 11/1999 | Pauls | |
| 6,009,203 | A | 12/1999 | Liu et al. | |
| 6,236,645 | B1 | 5/2001 | Agazzi | |
| 6,332,043 | B1 * | 12/2001 | Ogata | 382/240 |
| 6,349,138 | B1 | 2/2002 | Doshi et al. | |

OTHER PUBLICATIONS

Rahman et al., "Effects of a Binary Symmetric Channel on the Synchronization Recovery of Variable Length Codes", Computer Journal 32, p. 246-251, (Jan. 1989).

Elmasry, "Arithmetic Coding Algorithm with Embedded Channel Coding", Electronics Lett., 33 p. 1687-1688, (Sep. 1997).

Gitlin et al., "Null Zone Decision Feedback Equalizer Incorporating Maximum Likelihood Bit Detection", IEEE Trans. on Communications, 23 p. 1243-50 (Nov. 1975).

Kozintsev et al., "Image Transmission Using Arithmetic Coding Based on Continuous Error Detection", Proc. Of Data Compression Conf. p. 339-348, IEEE Computer Society Press, (1998).

Maxted et al., "Error Recovery for Variable Length Codes", IEEE Trans. on Information Theory, IT-31, p. 794-801, (Nov. 1985) examines the effect of errors on variable length codes.

Monaco, "Error Recovery for Variable Length Codes", IEEE Trans. on Information Theory, IT-33, p. 454-456, (May 1987) provides corrections and additions to the Maxted article.

Mruad and Fuja, "Robust Transmissions of Variable-Length Encoded Sources", in Proc. IEEE Wireless and Networking Conf. 1999, (Sep. 1999).

Park et al., "Decoding Entropy-Coded Symbols Over Noisy Channels by MAP Sequency Estimation for Asynchronous HMMs", Proc. Conference on Information Sciences and Systems, IEEE, (Mar. 1999).

Regunathan et al., "Robust Image Compression for time Varying Channels", Proc. Thirty-First Asilomar Conf. on Signals, Systems and Computers, p. 968-972, (Nov. 1997).

Sayood et al., "Implementation Issues in MAP Joint Source/Channel Coding", Proc. 22nd Annular Asilomar Conf. On Circuits, Systems, and Computers, p. 102-106, IEEE, (Nov. 1988).

Sayood et al., "Joint Source Channel Coding for Variable Length Codes", IEEE Transactions on Communications, 48 p. 787-794, (May 2000).

Sayood et al., Joint Source/Channel Coding for Variable-Length Encoded Sources. In Proc. IEEE Wireless and Networking Conference 1999. IEEE Sep. 1999.

Sherwood et al., "Progressive Image Coding for Noisy Channels", IEEE Signal Processing Lett., 4 p. 189-191, (Jul. 1997).

Soualhi et al., "Simplified Expression for the Expected Error Span Recovery for Variable Length Codes", Intl. J. of Electronics, vol. 75, p. 811-816, (Nov. 1993); Issue 5.

Swaszek et al., "More on the Error Recovery for Variable Length Codes", IEEE Trans. On Information Theory, IT-41, p. 2064-2071, (Nov. 1995).

Takishima et al., "Error States and Synchronization Recovery for Variable Length Codes", IEEE Trans. On Communications, 42, p. 783-792, Feb.-Apr. 1994.

Viterbi et al., "Principles of Digital Communications and Coding", McGraw Hill, 1979.

Wozencraft et al., "Principles of Communication Engineering", John Wiley & Sons, New York, 1965.

Yang, "Robust Image Compression Based on Self-Synchronizing Huffman Code and Inter-Subband Dependency", Proc. Thirty-Second Asilomar Conference on Signals, Systems and Computers, p. 986-972, Nov. 1997.

Yang et al., "Robust Image Compression Based on Self-Synchronizing Huffman Code and Inter-Subband Dependency", Proc. Thirty-Second Asilomar Conference on Signals, Systems and Computers, p. 1631-1635, IEEE, Nov. 1998.

Rahman et al., "Effects of a Binary Symmetric Channel on the Synchronization Recovery of Variable Length Codes", Computer Journal 32, p. 783-792, (Feb. 1994).

"Implementation Issues in MAP Joint Source/Channel Coding", Sayood, Liu and Gibson, Proc. 22nd Annular Asilomar Conf. on Circuits, Systems, and Computers, p. 102-106, IEEE, (Nov. 1988).

"Joint Source Channel Coding for Variable Length Codes", Sayood, Otu and Demir, IEEE Transactions on Communications, 48 p. 787-794, (May 2000).

* cited by examiner

SYSTEM AND METHOD FOR JOINT SOURCE-CHANNEL ENCODING, WITH SYMBOL, DECODING AND ERROR CORRECTION

Matter enclosed in heavy brackets [ ] appears in the original patent but forms no part of this reissue specification; matter printed in italics indicates the additions made by reissue.

[This Application is a CIP] *This is a reissue application of U.S. Pat. No. 6,892,343 B2 issued May 10, 2005, U.S. Pat. No. 6,892,343 B2 issued from U.S. application Ser. No. 09/816, 398 filed Mar. 24, 2001, which claims the benefit under 35 U.S.C. §119(e)* of *provisional* application Ser. No. 60/192,215 filed on Mar. 27, 2000.

TECHNICAL AREA

The present invention relates to source symbol encoding, decoding and error correction capability in the context of noisy channels in electronic communication systems. More particularly the prefered present invention is a system and method for joint source-channel encoding and variable length symbol decoding with error correction, comprising arithmetic encoder and combination sequential and arithmetic encoded symbol, decoder means.

BACKGROUND

With the increasing popularity of mobile communications there has come renewed interest in joint source-channel coding. The reason is that shared mobile communications channels are restrictive in terms of bandwidth and suffer from such as fading and interference etc., thus making some form of error protection essential, particularly where variable length codes are used. Further, it is well known that standard approaches to error correction are expensive, in terms of required bandwidth, hence there exists a need for systems and methodology which can provide efficient source and channel encoding and symbol decoding with error correction. Viable candidates include a joint source-channel encoding system and methodology which utilizes characteristics of a source, or source encoder, to provide error protection.

As background, it is noted that one of the earliest works that examined the effect of errors on variable length codes was that of Maxted and Robinson in an article titled "Error Recovery for Variable Length Codes", IEEE Trans. on Information Theory, IT-31, p. 794-801, (November 1985). Corrections and additions to said work were provided by Monaco and Lawlor in "Error Recovery for Variable Length Codes", IEEE Trans. on Information Theory, IT-33, p. 454-456, (May 1987). And said work was later extended by Soualhi et al. in "Simplified Expression for the Expected Error Span Recovery for Variable Length Codes", Intl. J. of Electronics, 75, p. 811-816, (November 1989), and by Rahman et al. in "Effects of a Binary Symetric Channel on the Synchronization Recovery of Variable length Codes", Computer J., 32, p. 246-251, (January 1989); as well as by Takishima et al. in "Error States and Synchronization Recovery for Variable Length Codes", IEEE Trans. on Communications, 42, p. 783-792; as well as by Swaszek et al. in "More on the Error Recovery for Variable Length Codes", IEEE Trans. on Information Theory, IT-41, p. 2064-2071, (November 1995)., all of which focused mainly on the resynchronization ability of Huffman Codes.

In terms of joint source channel coding where the source and source encoder characteristics are used to provide error protection, one of the earliest works which incorporated variable length codes was that of Sayood, Liu and Gibson in "Implementation Issues in MAP Joint Source/Channel Coding", Proc. 22nd Annular Asilomar Conf. on Circuits, Systems, and Computers, p. 102-106, IEEE, (November 1988). Assuming a Markov model for the source encoder output they used packetization to prevent error propagation and the residual redundancy at the source encoder output to provide error protection. This approach is used by Park and Miller who have developed a bit constrained decoder specifically for use with variable codes, (see "Decoding Entropy-Coded Symbols Over Noisy Channels by MAP Sequency Estimation for Asynchronous HMMs", Proc. Conference on Information Sciences and Systems, IEEE, (March 1999). Murad and Fuja, in "Robust Transmissions of Variable-Length Encoded Sources", Proc. IEEE Wireless and Networking Conf. 1999, (September 1999); and Sayood, Otu and Demir in "Joint Source/Channel Coding for Variable Length Codes", IEEE Transactions on Communications, 48:787-794, (May 2000), describe designs which make use of the redundancy at the source coder output for error correction.

The problem of low bandwidth hostile channels can also be addressed using error resilent source codes which incorporate the possibility of errors in the channel and provide mechanisms for error concealment. Work in the area includes that of Yang. et al. as reported in "Robust Image Compression Based on Self-Synchronizing Huffman Code and Inter-Subband Dependency", Proc. thirty-second Asilomar Conference on Signals, Systems and Computers, p. 986-972 (November 1997), who use the self-synchronizing property of suffix rich Huffman codes to limit error propagation, and correlation between subbands to provide error correction/concealment.

In addition, there exist a number of concatenated schemes in which the source and channel encoders are concatenated in the traditional manner with channel resources allocated between them based on the characteristics of the channel. If the channel is very noisy, more bits are allocated to the channel and fewer to source encoding, and the situation is reversed when the channel conditions are more favorable. Examples of this approach include the work of Regunathan et al. as presented in an article titled "Robust Image Compression for Time Varying Channels", Proc. Thirty-first Asilomar Conf. on Signals, Systems and Computers, p. 968-972, (November 1997) and in an article titled "Progressive Image Coding for Noisy Channels", by Sherwood et al., IEEE Signal Processing Lett., 4 p. 189-191, (July 1997).

Most of the schemes referenced above use Huffman coding or variants thereof as the variable length coding scheme, however, with the increasing popularity of arithmetic coding, there has developed interest in joint source channel coding schemes which use said arithmetic coding. One such approach is described in "Arithmetic Coding Algorithm with Embedded Channel Coding", ElMasry, Electronics Lett., 33 p. 1687-1688, (September 1997); and another is described in "Integrating Error Detection into Arithmetic Coding", Boyd et al., IEEE Transactions on Communications, 45(1), p. 1-3, (January 1997). The ElMasry approach involves generation of parity bits which are embedded into arithmetic coding procedure for error correction. The Boyd approach showed that by reserving probability space for a symbol which is not in the source alphabet the arithmetic code can be used for detecting errors. Reserving probability space for a symbol that will never be generated means that less space remains for the source alphabet and this translates into a higher coding rate. Said overhead, however, is small considering the capability of error detection enabled, as described by Kozintsev et al. in "Image Transmission Using Arithmetic Coding Based on Continuous Error Detection", Proc. of Data Compression Conf. p. 339-348, IEEE Computer Society Press, (1998) regarding two scenarios, (eg. Automatic Repeat Request (ARQ) based communications and serially concatenated coding schemes with an inner error correction code and an outer error detection code), which use error detecting capability of the arithmetic code with an error detection space.

With an eye to the present invention a Key-word Search for relevant Patents which involve inner and outer coding, trellis coding, data compression, error detection, error correction, variable length coding, arithmetic coding, and data transmission over noisy channels, has provided:

U.S. Pat. No. 5,200,962 to Kao et al. is disclosed as it describes data compression with error correction.

U.S. Pat. No. 5,745,504 to Bang is disclosed as it describes bit error resilient variable length code transmission.

U.S. Pat. No. 6,009,203 to Liu et al. is disclosed as it describes variable length coding.

U.S. Pat. No. 5,233,629 to Paik et al. is disclosed as it concerns trellis coded quadrature amplitude modulation.

U.S. Pat. No. 4,862,464 to Betts et al. is disclosed as it describes error detection in digital modems using trellis coding.

U.S. Pat. No. 5,206,864 to McConnell is disclosed as it concerns optimization of error correction, inner and outer coding.

U.S. Pat. No. 5,841,794 to Inoue et al. is disclosed as it describes error correction for digital data.

U.S. Pat. No. 5,910,967 to Vanderaar is disclosed as it describes concatenated coding in which an inner code is configured to match the needs of an outer code.

U.S. Pat. No. 5,870,405 to Hardwick et al. is disclosed as it describes digital communication over noisy channels.

U.S. Pat. No. 5,517,511 to Hardwick et al. is disclosed as it describes transmission of digital data over noisy channels.

U.S. Pat. No. 5,983,382 to Pauls is disclosed as it concerns outer coding.

Patents disclosed because they discuss Arithmetic coding are:

U.S. Pat. No. 5,311,177 to Kimura et al.;
U.S. Pat. No. 5,587,710 to Choo et al.;
U.S. Pat. No. 5,418,863 to Ando;
U.S. Pat. No. 4,295,125 to Langdon, Jr;
U.S. Pat. No. 4,286,256 to Langdon, Jr. et al;
U.S. Pat. No. 5,774,081 to Cheng et al.;
U.S. Pat. No. 5,715,332 to Nakanishi;
U.S. Pat. No. 5,710,826 to Osawa et al.;
U.S. Pat. No. 5,317,428 to Osawa et al.

No known reference or combination of references, however, discloses use of a joint source-channel encoding, symbol decoding and error correction system comprising encoder means, modulation-transmission means, and combination sequential, and encoded symbol, decoding means; wherein errors detected by the encoded symbol decoding means are corrected by methodlogy involving the changing of bistable elements in said sequential decoder means, or selection of a series of sequential bits from a plurality of said serieses of sequential bits which result from changing bistable elements in said sequential decoder means, particularly where said encoder means is an arithmetic encoder and encoded symbol decoding means comprises arithmetic decoder, and encoded symbols are of variable length.

DISCLOSURE OF THE INVENTION

The present invention can be characterized as a system and method involving a concatenated scheme in which the functional roles of both:

outer code error detection; and
inner code error correction;

are facilitated by a joint source-channel encoder which comprises operational reserved symbol probability space. In a general preferred embodiment, outer code error detection is performed by an encoded symbol decoder means, and inner code error correction is achieved utilizing a sequential decoder means which uses information from both a channel output and the encoded symbol decoder means. In the preferred embodiment the symbol encoder means is an arithmetic encoder means and the encoded symbol decoder means is an arithmetic decoder means with error detection capability that functions by detecting the presence of encoded reserved symbol(s), which are not allowed as input to said source-channel encoder means.

The present invention system can be described as a variable symbol length, joint source-channel encoding, symbol decoding and error correction system comprising:

encoder means;
modulation-transmission means; and
combination sequential, and encoded symbol, decoding means;

wherein the encoder means comprises input means for accepting a sequential plurality of "allowed input symbols" and output means for outputting an encoded sequence of bits for allowed symbols input thereinto; where the terminology "allowed input symbols" indicates symbols which when detected by the decoding means will not typically identify that an error has occurred, (ie. they are a part of an allowed alphabet of input symbols). Further, the symbol encoder means is functionally interconnected to said modulation-transmission means such that entry of a symbol to said encoder means results in said encoder means outputting an encoded sequence of bits therefore into said modulation-transmission means, and said modulation-transmission means and combination sequential, and encoded symbol, decoding means are functionally interconnected such that an encoded symbol sequence of bits entered to said modulation-transmission means enters said combination sequential, and encoded symbol, decoding means. Importantly, said sequential decoding means comprises a plurality of bistable elements. Continuing, said encoded symbol decoding means comprises means for initiating an error correction routine to the end that, upon the encountering the presence of an unexpected encoded reserved symbol:

at least one bistable element in said sequential decoding means is changed; or
selection is made of a series of sequential bits, said selection being made from a group consisting of a plurality of such series of sequential bits which result from the changing of bistable elements in said sequential decoder means;

wherein the terminology "reserved symbol" is used to identify a symbol not allowed as an input symbol to said symbol encoding means, and which, upon being detected by the encoded symbol decoding means will trigger an error correcting routine.

Said encoder means can optionally further comprise means for generating, and in a sequence expected by said encoded symbol decoding means, outputting an encoded sequence of bits for at least one reserved symbol before and/or after an encoded allowed input symbol, which reserved symbol is not allowed as an input symbol to said encoder means input means. In use, the present invention then provides that, upon the detecting of the absence of an expected encoded reserved symbol, as well as upon detecting the presence of an unexpected encoded reserved symbol:
at least one bistable element in said sequential decoding means is changed; or
selection is made of a series of sequential bits, said selection being made from a group consisting of a plurality of such series of sequential bits which result from the changing of bistable elements in said sequential decoder means.

(Note that the selections just recited correspond to serial and parallel decoding error correction schemes, respectively).

Continuing, where the encoder means and encoded symbol decoder means are arithmetic, the present invention joint source-channel encoding, decoding and error correction system can be described as comprising:

arithmetic encoder means;

modulation-transmission means; and decoding means;

wherein said arithmetic encoder means comprises input means for accepting a sequential plurality of allowed input symbols and output means for outputting an encoded sequence of bits for allowed symbols input thereinto, and wherein said decoding means comprises a functional combination of:

a sequential decoder means which comprises a sequence of bistable elements, each of which can be set to represent encoded symbol bits, and an arithmetic decoder means.

Further, said arithmetic encoder means is functionally interconnected to said modulation-transmission means and said modulation-transmission means is functionally interconnected to said decoding means. In use, said arithmetic encoder means is caused to receive a sequence of allowed symbols at its input means and provides an encoded sequence of bits for at least some thereof, said sequence of bits being caused to arrive at said decoding means. Continuing, said arithmetic decoder means has error detection means such that in use said arithmetic decoder means, upon detecting the presence of an unexpected encoded reserved symbol, initiates an error correction routine to the end that:

at least one bistable element in said sequential decoding means is changed; or selection is made of a series of sequential bits, said selection being made from a group consisting of a plurality of such series of sequential bits which result from the changing of bistable elements in said sequential decoder means.

As described with respect to the first recitation of a present invention system, said reserved symbol is not allowed as an input symbol to said symbol encoding means, and the selections just recited correspond to sequential and parallel error correction schemes, respectively.

Where the encoder means and encoded symbol decoder means are arithmetic, the present invention joint source-channel encoding, decoding and error correction system can be more precisely described as comprising:

arithmetic encoder means;

modulation-transmission means; and decoding means;

wherein said decoding means comprises a functional combination of a sequential decoder means which comprises a sequence of bistable elements, each of which can be set to represent encoded symbol bits, and an arithmetic decoder means. Further, said arithmetic encoder means comprises input means for accepting a sequential plurality of allowed input symbols and output means for outputting an encoded sequence of bits for allowed symbols input thereinto, and said arithmetic encoder means further has means for generating and, in a sequence expected by said arithmetic decoder means, outputting an encoded sequence of bits for at least one reserved symbol before and/or after an encoded allowed input symbol, which reserved symbol is not allowed as an input symbol to said arithmetic encoder means input means. Said arithmetic encoder means is functionally interconnected to said modulation-transmission means and said modulation-transmission means is functionally interconnected to said decoding means. In use said arithmetic encoder means receives a sequence of allowed symbols at its input means and provides an encoded sequence of bits for at least some thereof in combination with a sequence of bits which represent at least one encoded reserved symbol in a pattern expected by said arithmetic decoder means, said sequence of bits being caused to arrive at said decoding means. Importantly, said arithmetic decoder means has error detection means such that in use said arithmetic decoder means, upon detecting:

the absence of an expected encoded reserved symbol; or the presence of an unexpected encoded reserved symbol;

initiates an error correction routine to the end that:

at least one bistable element in said sequential decoding means is changed; or selection is made of a series of sequential bits, said selection being made from a group consisting of a plurality of such series of sequential bits which result from the changing of bistable elements in said sequential decoder means.

A method of practicing the present invention, assuming the presence of an arithmetic encoder and arithmetic encoded symbol decoding system, can be recited as:

a. providing a present invention system as recited above;

b. inputting a plurality of symbols to the input means of said arithmetic encoder means;

c. causing said arithmetic encoder means to encode at least some of said plurality of symbols and output bits corresponding thereto, optionally intermingled with at least one arithmetic encoder means generated encoded reserved symbol, into said modulation-transmission means;

d. causing said modulation-transmission means to enter said at least some of said plurality of encoded symbols along with at least one encoded reserved symbol entered into said modulation-transmission means, into said functional combination of said sequential decoder means and arithmetic decoder means;

e. causing said arithmetic decoder means to, if detecting non-present expected or present unexpected encoded reserved symbol(s):

change at least one bistable element in said sequential decoder means; or select a series of sequential bits, said selection being made from a group consisting of a plurality of such series of sequential bits which result from the changing of bistable elements in said sequential decoder means.

It is noted that the arithmetic encoder means and decoding means, which comprises a sequential decoder means and an arithmetic decoder means, can be any electronic systems which perform the indicated function.

It is felt beneficial to provide insight to a specific error correction procedure which can be performed by the present invention. Again, a present invention joint source-channel encoding system can be considered to be sequentially comprised of:

an arithmetic encoder;

a modulation-transmission channel;

a sequential decoder means; and an arithmetic decoder;

said arithmetic encoder feeding to said transmission channel, and said transmission channel feeding to said sequential decoder means, and said arithmetic decoder having access both from and to said sequential decoder means. In use, a sequence of symbols is entered into said arithmetic encoder with the result being that said sequence of symbols is encoded and exited therefrom as a binary bit stream sequence of $+x\sqrt{Es}$ and $-x\sqrt{Es}$ signals, corresponding to a string of "1"/("0")'s and "0"/("1")'s which pass through said transmission channel and enter said sequential decoder means, (where said x is a fraction). Hard logic circuit decisions are made as to the presence of "1"/("0")'s and "0"/("1")'s based on said binary bit stream sequence of $+x\sqrt{Es}$ and $-x\sqrt{Es}$ signals while identify decisions based upon signals wherein "x" is of a value so as to cause the values of $+x\sqrt{Es}$ or $-x\sqrt{Es}$ to be within a null zone of $+\Delta$ to $-\Delta$ around 0.0, and identifying said decisions as "branch point" decisions in said sequential decoder means. Further, monitoring output from said arithmetic decoder results in detection of errors, and when an error is indicated thereby, a "branch point" is identified in said sequential decoder means and an inversion of "1"/("0") or "0"/("1") based binary bit thereat to "0"/("1") or "1"/("0") is effected as an attempt to correct said detected error.

A method of correcting errors in decoded symbols which are encoded by an arithmetic encoder in joint source-channel coding system, comprises the steps of:

a. providing a present invention system as recited above;

b. entering a sequence of symbols into said arithmetic encoder such that said sequence of symbols are encoded and exited therefrom as a binary bit stream sequence of $+x\sqrt{Es}$ and $-x\sqrt{Es}$ signals, corresponding to a string of "1"/("0")'s and "0"/("1")'s which pass through said transmission channel and enter said sequential decoder means, where x is a fraction;

c. making hard logic circuitry decisions as to the presence of "1"/("0")'s and "0"/("1")'s based on said binary bit stream sequence of $+x\sqrt{Es}$ and $-x\sqrt{Es}$ signals while identify decisions based upon signals wherein x is of a value so as to cause the values of $+x\sqrt{Es}$ or $-x\sqrt{Es}$ to be within a null zone of $+\Delta$ to $-\Delta$ around 0.0, and identifying said decisions as "branch point" decisions in said sequential decoder means;

d. monitoring output from said arithmetic decoder for errors and when an error is indicated thereby, identifying a "branch point" in said sequential decoder means and correcting the "1"/("0") or "0"/("1") based binary bit thereat by inverting it to "0"/("1") or "1"/("0").

Said method of error correction can involve step d. being practiced more than once, with said error correcting method further comprising the step of:

e. defining a tolerable Hamming distance threshold Tc, and keeping count of the number Kc of "branch points" in said sequential decoder means at which correction of the "1"/("0") or "0"/("1") based binary bit thereat by inverting to "0"/("1") or "1"/("0") has been performed; and if Kc exceeds Tc, expanding the null zone by increasing the magnitude of $\Delta$, thereby making available additional "branch points".

Further, said error correction method can further comprise the step of:

f. determining in a second or greater practice of step e. if the identified "branch point" is sequentially prior to the "branch point" identified in the immediately previous practice of step e. and if so decreasing the value of Kc by 1, otherwise increasing the value of Kc by 1.

Alternatively, said error correcting method can involve practice of step d. more than once, with said error correcting method further comprising the step of:

e. defining a means for calculating a Euclidean distance between received and decoded symbols, and a tolerable rate of increase of Euclidean distance between sequential practice of step d., and if said Euclidean distance increases faster than at said tolerable rate, expanding the null zone by increasing the magnitude of $\Delta$, thereby making available additional "branch points".

Again, the error detection method, in step d., involves the determination of the presence or absence of non-alphabet, (ie. reserved), symbols other than as expected, said non-alphabet symbols being not-allowed as arithmetic encoder input symbols.

The just described approach to correcting errors requires that "branch-points" in the sequential decoder means be determined based upon a "null-zone" criteria, and involves retracking the contents of the sequential decoder means, and selectively changing an identified "1"/("0") to "0"/("1"), when an error is identified. It is possible, however, to identify bistable elements in said sequential decoder means and define them as fixed branch points, based upon the modulation technique utilized. For instance, if a trellis coded modulation scheme is utilized, a well known 8-PSK Constellation Codeword Assignment approach can be practiced. When such an approach to correcting errors in decoded symbols which are encoded by an arithmetic encoder in joint source-channel coding system is utilized, the method thereof can be described as comprising the steps of:

a. providing a joint source-channel encoding, decoding and error correction, system comprising:

arithmetic encoder means;

modulation-transmission means; and decoding means;

wherein said decoding means comprises a functional combination of a sequential decoder means which comprises a sequence of bistable elements, each of which can be set to represent encoded symbol bits, and an arithmetic decoder means. Specific bistable elements in said sequential decoder means are identified as branch points based upon the modulation scheme utilized, (eg. Trellis Coded Modulation and application of 8-PSK Constellation Codeword Assignment Criteria). Said arithmetic encoder means further comprises input means for accepting a sequential plurality of allowed input symbols and output means for outputting an encoded sequence of bits for allowed symbols input thereinto, and said arithmetic encoder means further optionally has means for generating and, in a sequence expected by said arithmetic decoder means, outputting an encoded sequence of bits for at least one reserved symbol before and/or after an encoded allowed input symbol, which reserved symbol is not allowed as an input symbol to said arithmetic encoder means input means. Said arithmetic encoder means is functionally interconnected to said modulation-transmission means and said modulation-transmission means is functionally interconnected to said decoding means, such that in use, said arithmetic encoder means receives a sequence of allowed symbols at its input means and provides an encoded sequence of bits for at least some thereof in optional combination with at least one encoded reserved symbol in a pattern expected by said arithmetic decoder means, said sequence of bits being caused to arrive at said decoding means. Said arithmetic decoder means has error detection means such that in use said arithmetic decoder means, upon detecting the absence of an expected encoded reserved symbol, or the presence of an unexpected encoded reserved symbol, initiates an error correction routine to the end that:

selection is made of a series of sequential bits, said selection being made from a group consisting of a plurality of such series of sequential bits which result from the changing of bistable elements in said sequential decoder means at said specific branch points;

is performed. Said method continues with practice of the following steps:

b. entering a sequence of symbols into said arithmetic encoder means such that said sequence of symbols are encoded and exited therefrom as a binary bit stream sequence;

c. monitoring output from said arithmetic decoder means for errors;

d. when an error is detected by said arithmetic decoder means, (eg. by detecting a present unexpected or non-present expected encoded symbol), by using said specific branch point bistable elements in said sequential decoder means, producing a plurality of series of sequential bits which result from the changing of bistable elements in said sequential decoder means at said specific branch points; and e. determining which series of sequential bits in said produced plurality of series of sequential bits is most likely correct.

Said method of correcting errors in decoded symbols can, in step e., involve determining which series of sequential bits in said produced plurality of series of sequential bits is most likely correct based on applying at least on selection from the group consisting of:

a. eliminating any series of sequential bits which contains an encoded reserved symbol;

b. applying a metric to at least two series of sequential bits which do not contain an encoded reserved sysbol, to determine which of said at least two series of sequential bits is most likely correct;

c. applying an Euclidean metric to at least two series of sequential bits which do not contain an encoded reserved sysbol, to determine which of said at least two series of sequential bits is most likely correct.

Finally, it is specifically noted that, while not limiting, it is believed that Patentability is definitely established where the present invention system is comprised of an arithmetic encoder means, in combination with a decoding means which is comprised of a functional combination of a sequential decoder means and an arithmetic decoder means, wherein in use, error correction methodology is initiated upon the detecting, by the arithmetic decoder means, of a non-expected encoded reserved symbol, or the absence of an expected encoded reserved symbol sequentially inserted with encoded allowed symbols by the arithmetic encoder means. It is also noted that no arithmetic encoder means is known which provides operational error detection space. Computer simulation thereof, and of sequential and arithmetic decoder means then serve as example systems.

The present invention will be better understood by reference to the Detailed Description Section in combination with the Drawings.

SUMMARY OF THE INVENTION

It is therefore a primary purpose and/or objective of the present invention to provide a system comprising an outer symbol encoder means which comprises operational error detection space, and a combination sequential, and encoded symbol, decoding means, wherein said outer encoder means is preferably an arithmetic encoder, and the encoded symbol, decoding means is preferably an arithmetic decoder.

It is another purpose of the present invention to disclose use of reserved symbols as means to enable encoded symbol, decoding means, (arithmetic decoder), to identify errors, said identified errors being corrected by the changing of at least one bit is an associated sequential decoder means.

It is another purpose yet of the present invention to teach that error detection by an arithmetic decoder means can be based on detecting the presence of an unexpected encoded symbol or on detecting the absence of an expected encoded symbol.

It is yet another purpose of the present invention to disclose methods of enhancing the operation of the sequential decoder means in correcting of errors involving distance calculations, (eg. Hamming and Euclidean distances).

It is a further purpose of the present invention to identify use of "null-zones", or use of modulation technique determined specific "branch points" in a sequence of bistable elements in a sequential detector means.

Other purposes and/or objectives will become obvious from a reading of the Specification and Claims.

DETAILED DESCRIPTION

Figure 1A:
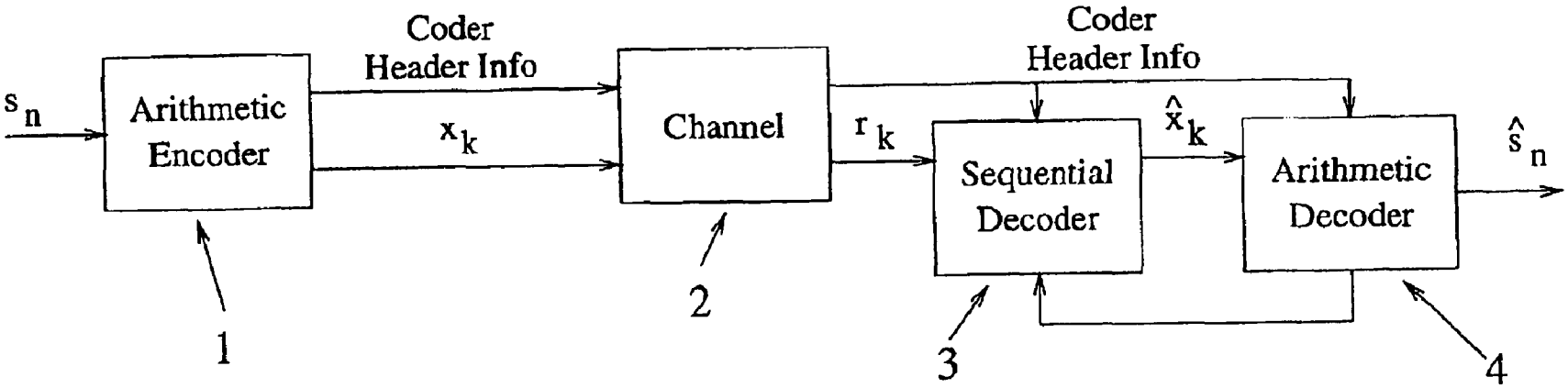
FIG. 1a shows a preferred embodiment of the present invention system applied in a sequential decoding error correction scheme, said system comprising a concatenation of an Outer Arithmetic Encoder (1), (which comprises operational Error Detection Space); a Modulation-Transmission means (2), (ie. a Channel); and a functional combination of an Inner Sequential Decoder (3) and an Outer Arithmetic Decoder (4).

Turning now to the Drawings, there is shown in FIG. 1a, a preferred embodiment of the present invention system which is applied in a sequential decoding error correction scheme. Shown are a concatenation of an Outer Arithmetic Encoder (1), (which comprises operational Error Detection Space); a Modulation-Transmission means (2), (ie. a Channel) and a functional combination of an Inner Sequential Decoder (3) and an Outer Arithmetic Decoder (4). Note said the Sequential (3) and the Arithmetic (4) Decoders in combination are herein termed a Decoding means. Shown entering to the Arithmetic Encoder (1), (at input means for accepting a sequential plurality of allowed input symbols), are Symbols ($s_n$), which Symbols ($s_n$) are members of an allowed alphabet. Shown exiting the Arithmetic Encoder (1), (at output means for outputting an encoded sequence of bits for allowed symbols input to said encoder means), is a binary bit stream ($x_k$) which arrives at the Sequential Decoder (3) from Modulation-Transmission means (2) as a sequence of binary bits ($r_k$). Exiting said Sequential Decoder (3) is a sequence of ($\hat{x}_k$), with ($\hat{x}_k$) representing a sequence of hard decisions from the channel output based on optimal symbol by symbol detection. A parameter $d(r_k\ \hat{x}_k)$ is defined to be a distance, in some sense, between the decoded and received signal at a time (k). Where convolution decoders are utilized this is often taken to be the Hamming Distance, (based on hard decisions ($\hat{x}_k$) between received and decoded sequences). The various possible decoded sequences can be viewed as a binary tree with the correct sequence being a path through said tree.

In use then the Arithmetic Encoder sends a binary stream of bits ($x_k$) into the Modulation-Transmission means (2), in some mapped form, (eg. mapped to $+/-\sqrt{Es}$ for BPSK signaling).

(Note: BPSK stands for Binary Phase Shift Keying).

In the traditional sequential decoding scenario the structure of the convolution code imposes a restriction on possible decoded sequences and, hence, on possible branch points along a path. By discarding branches in which an error has been detected, the decoding tree can be pruned such that what is left is the decoded sequence with the lowest Hamming Distance from the received sequence. The structure of the convolution code then defines the valid paths in the tree. The job of the Decoder is then primarily to find the valid path that results in a decoded sequence with the minimum distance from the received sequence.

Where Arithmetic Encoders are utilized, the situation is not as simple. To apply sequential decoding procedures to the case wherein an Arithmetic Encoder is utilized, two considerations become important:

1. need for a condition enabling error detection, (a solution thereof comprising a new and novel aspect of the present invention); and
2. need for a decoding tree.

The first requirement is easily satisfied if use is made of error detection space in the Arithmetic Encoder, and in fact, it is noted that it is satisfied in a stronger manner than where convolution encoding is utilized. That is, in the Arithmetic Encoding case in which use is made of error detection space, the appearance of a symbol corresponding to the error detection space is a definite indication of error.

The second requirement is not as easily satisfied. This is because unlike in the convolution encoder case, the output of the arithmetic encoder is not restricted in terms of bit patterns which it can output, hence, an associated tree would have each bit as a branch point and the tree grows exponentially with the number of bits in a sequence. Thus it becomes necessary to identify specific branch points which are most-likely to be the location of error, and to arrive at a more rational code tree. Present invention methodology makes use of information available at the output of the Modulation-Transmission means (2), (ie. a Channel), to obtain what are the most likely error branch points.

Figure 2:
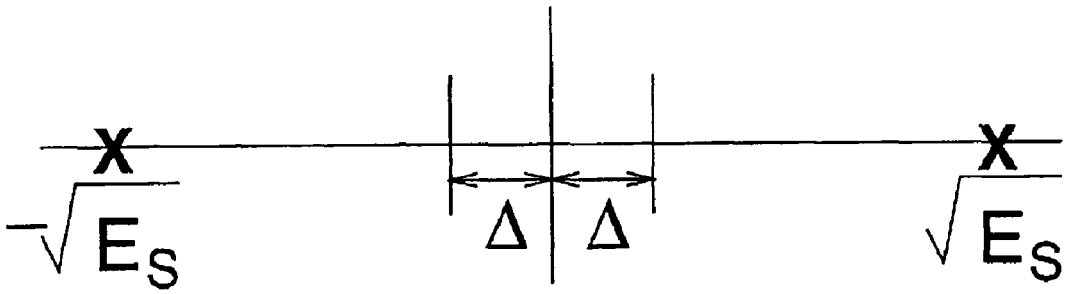
FIG. 2 shows a "null zone" in a signal space for assumed binary BSPK signalling in an additive white Gaussian noise channel.

Assuming binary BSPK signalling and an additive white Gaussian noise channel, the signal space can be represented as shown in FIG. 2. Further, "hard" decision receiver implementation decodes received signals as a "0" or "1" depending on whether ($r_k$) is positive or negative. Using the language of Gitlin and Ho in "Null Zone Decision Feedback Equalizer Incorporating Maximum Likelihood Bit Detection:, IEEE Trans. on Communications, 23 p. 1243-1250, (November 1975), a region of width 2 Δ around the origin is termed the "null zone". Received signals, the signal space projections of which land in said "null zone", are, under present invention procedure, identified as branch point candidates, and it is noted that the number of so identified branch points can be increased or decreased by adjusting the magnitude of Δ.

The number of possible paths can be represented as a fully connected binary Trellis, such as shown in 3. The heavy lines in the FIG. 3 Trellis indicate the path of a decoded signal, and the circled nodes indicate where the received signals fell into the null zone. The circled nodes, it is specifically noted, are the branch points, as defined in present invention methodology. FIG. 4 shows the FIG. 3 branch points in a decoding Tree representation. Further, it should be understood that present invention methodology requires that the data represented by the heavy lines in FIG. 3 be stored in the Sequential Decoder (3) shown in FIG. 1a.

Figure 3:
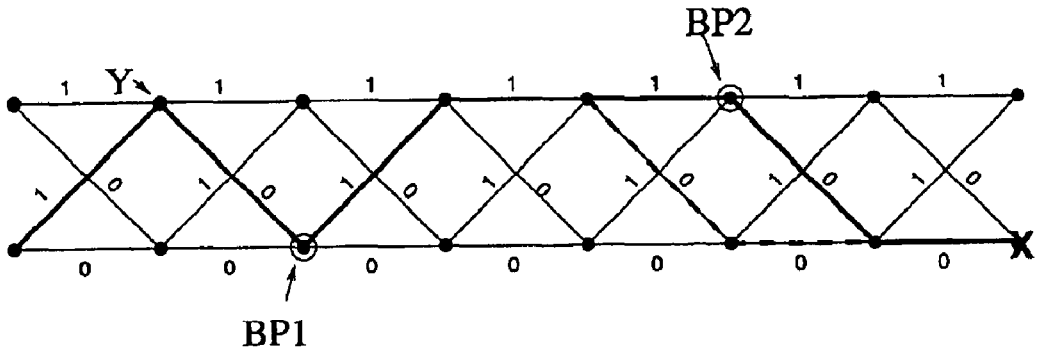
FIG. 3 shows possible signal paths can be represented as a fully connected binary Trellis.
Figure 4:
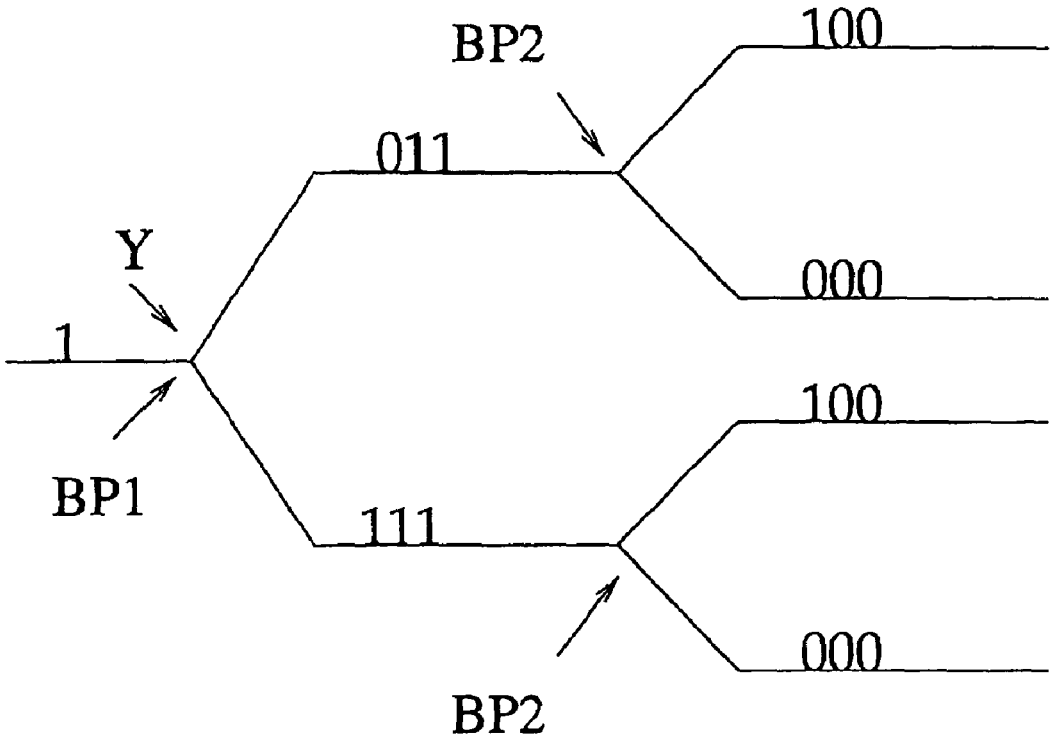
FIG. 4 shows a decoding tree for the FIG. 3 scenario, assuming error possibilities at each of the Branch Points.

To aide with understanding, suppose that at point "X" in FIG. 3 an error is detected. The present invention methodology then requires that data stored in the Sequential Decoder (3) be modified to attempt to remove the detected error. Present invention methodology would back up in the Sequential Decoder (3) to the Bit identified as "Y", which Bit "Y" is also indicated in FIG. 4. proceeding in FIG. 3 the next Bit is a Branch point (BP1), which is again identified in FIG. 4. Note that two possibilities exist at (BP1), and are represented in FIGS. 4 as (011) and (111). Similarly at (BP2) FIG. 4 shows that for each of the two branches stemming from (011) and (111), two Branch Point possibilities exist, leading to the four possibilities (100) (000), (100) and (000) shown in FIG. 4. (Note that if a quadrature scheme were utilized, the Tree of FIG. 4 would have four possibilities at each Branch Point (BP1) and (BP2)).

As a specific example, consider that the output of an Arithmetic Encoder is transmitted using a binary signalling scheme with $\sqrt{E_{s=1}}$. Further consider that said output is transmitted over a Modulation-Transmission means (2), (ie. a Channel), which corrupts it with additive noise such that the output of a signal receiver would provide:

$$R_k=\{-1.06, -1.06, -0.14, 1.56, -1.11, -1.39 \ldots 0.09. 0.04. 0.67. -1.55, 1.03, 0.71\}.$$

Figure 5:
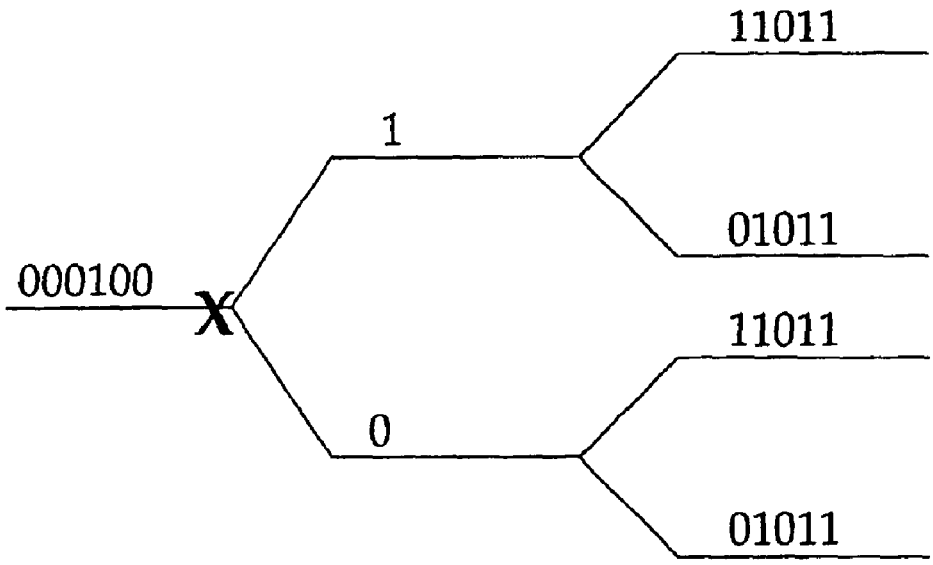
FIGS. 5 and 6 show additional decoding trees which are described in the text.

If Δ=0.1 is chosen for the null zone magnitude, and hard decoding is performed on the received values while marking bits corresponding to signals that fall in the null zone by a "*", then the following results:

$$\hat{X}_{\Delta=0.1}=\{0,0,0,1,0,0,*1,*1,1,0,1,1\};$$

and the Tree of FIG. 5 results. Decoding the received bits using an Arithmetic Decoder (4) it is found that reading the sixth bit the decodes the symbol corresponding to the error detection space. The fact that the symbol corresponding to the error detection space has been decoded is denoted in FIG. 5 with an "X". If the current path is discarded then the decoding has to be terminated. Therefore the path is retraced to the root of the Tree and the Δ is increased so that Δ=0.2. This causes one of the signals that was originally outside the null zone to fall inside the null zone thus providing additional branch points so that the decoded bit sequence becomes:

$$\hat{X}_{\Delta=0.2}=\{0,0,\bar{1},1,0,0,*1,*1,1,0,1,1\}$$

where denotes the explored branch point and the * denotes unexplored branch points.

Figure 6:
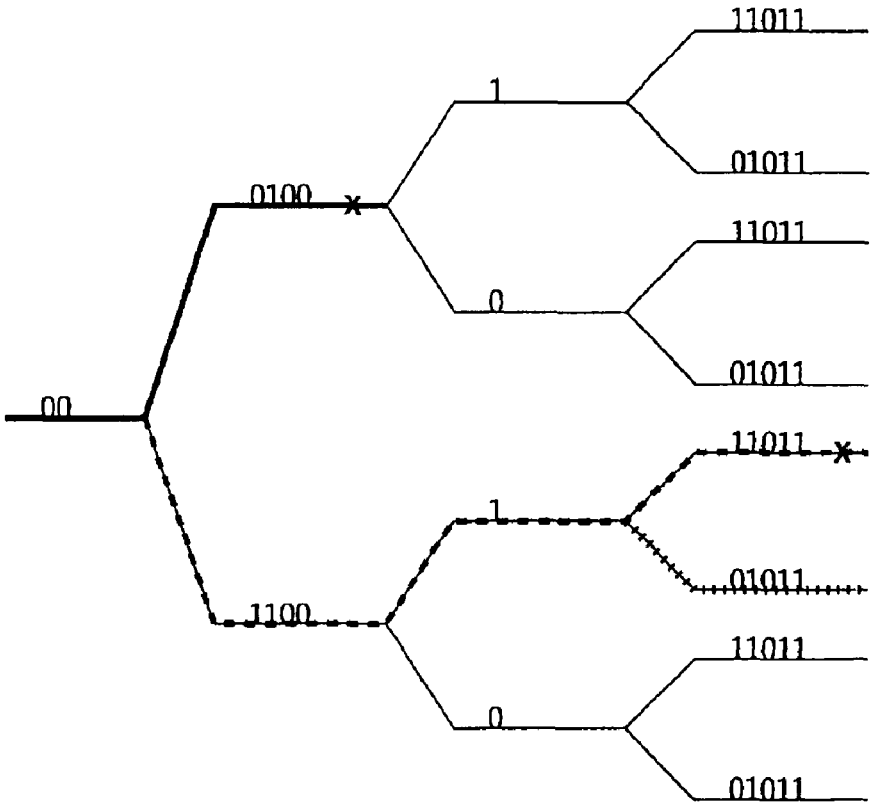

FIG. 6 shows the new decoding Tree corresponding to said binary string. The decoding begins at the root and the error is detected as before. However, this time there exists an alternative. Instead of progressing along the upper branch, steps are retraced to the first branch point and then a path along the lower branch is pursued. The new path is denoted in FIG. 6 as a dashed line. This time , after the $10^{th}$ bit an error is detected. Hence, steps are retraced once again to the previous branch point and progress is pursued down the dotted line to find the decoded sequence.

In order to capture an error it is sufficient that Δ be greater than the magnitude of the error. It would seem then that selecting a large value for Δ is desirable, however, as already mentioned, such an approach leads to proliferation of branches in a resulting Tree. Further, it is known that small magnitude errors are more likely than are large magnitude errors, and as a result large values of Δ typically do not provide significant benefit. Also, it is noted that the probability of an error being within the last "n" symbols is:

$$1-(1-\epsilon)^n$$

and as a result it is possible to keep the default value of small, and increase it for signals corresponding to the last "n" symbols when an error is detected. Another consideration is that the probablity of an error being in a symbol close to the point at which an error is detected is higher than the probability of the error being in a symbol further away. With that in mind it is again noted that the reason for increasing the value of Δ is to increase the number of branch points and that if the number of branch points is increased too far, computational time can be wasted pursuing wrong paths. This leads to the insight that the null zone magnitude can beneficially be adjusted in a discriminating manner, and an algorithm enabling this is:

let $\Delta_{inc}$ be the amount by which Δ is increased at each step, and let $L_{nz}$ be the number of symbols over which it is proposed to increase the value of Δ.

Figure 7:
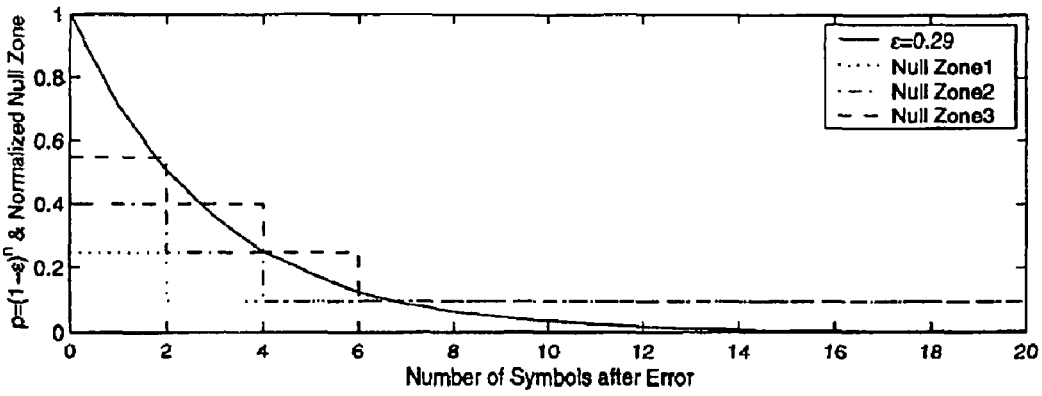
FIG. 7 shows and example of null zone expansion for $\Delta=0.1$, $\Delta_{inc}=0.2$, and $L_{nz}=2$.

When an error is detected the path thereto is retraced for the purpose of locating a branch point. If sufficient bits corresponding to $L_{nz}$ symbols are retraced then the null zone is expanded by increasing Δ by $\Delta_{inc}$ for all signals corresponding to the bits from the current position to the bits corresponding to the farthest symbol forward where an error was detected. Next the path is proceeded along forward with arithmetic decoding. If an error is detected within the next $L_{nz}$ symbols retracing is pursued through bits corresponding to $2L_{nz}$ symbols before expanding the null zone. This time the null zone is incremented for all signals from the current position to the farthest position where an error was detected by $\Delta_{inc}$. Note that this has the effect of increasing the null zone within $L_{nz}$ symbols of the error detection by $2L_{nz}$. If a correct path is still not available on the decoding tree and steps corresponding to $3L_{nz}$ have been retraced, the null zone is again incremented to all signals from the current location to the farthest point forward where an error was detected by $\Delta_{inc}$. This procedure is continued until the correct path is found, or the computational burden exceeds a predetermined threshold. In the later case a decoding error is declared. By expanding the null zone in this manner the result is that null zones at different signal locations are approximately proportional to the probability of an error being detected, as shown in FIG. 7. Further, if channel characteristics are known, the probability of an error escaping the null zone can be calculated. For instance, if the channel is an AWGN, (ie. Added White Gaussian Noise), channel and the signal to noise ratio over the channel is 10 dB then the probability of a hard decision error is around $10^{-4}$. The probability of the error falling outside of a null zone with $\Delta=0.4\sqrt{E_s}$ is about $10^{-14}$. If an acceptable packet loss rate for the scheme is around $10^{-6}$ then an increase in the null zone beyond $0.4\sqrt{E_s}$ could not be justified. Because of this condition a maximum null zone, denoted as $\Delta_{max}(p)$, is chosen for a given probability of transmission error.

It is noted that in an arithmetic decoder an error will almost always propagate. However, the use of detection space essentially guarantees that any error will eventually be detected. The "Depth First" algorithm allows correction of the errors by exploring branches of a code tree, but said approach can become computationally expensive. It is, however, possible to prune a code tree in order to reduce the number of computations. Several constraints can be used to accomplish said pruning the code tree, and the inventors herein have made use of the fact that making incorrect "corrections" causes increased deviation from a correct path. Detection of proceeding along an incorrect path can be accomplished by, for instance, keeping track of Hamming distance, and/or keeping track of a Squared distance in the Euclidean sense.

Regarding the Hamming distance approach, keeping continuous track of the number of corrections still extant is key, with said count being compared against a threshold ($T_h$). The value of ($T_h$) is the maximum Hamming Distance between a received and decoded sequence which it is decided can be tolerated. The reasoning is that the probability of more errors is less than the probability of fewer errors, and that if an additional correction make the number of corrections extant greater than ($T_h$), then the null zone should be expanded by increasing the value of Δ. Expanding the null zone increases the number of possible branch points and this increases the possibilities for decoding sequences at a distance ($T_h$) or less from the received sequence.

Regarding the approach based on Euclidean distance, a squared distance between received and decoded symbols is monitored. A running sum of the distance between the sequential decoder output ($x_k$) and the received sequence is computed and compared to the distance between the output of the hard decision decoder ($x_k$) and the received sequence. At a time "n" this is accomplished by comparing the Euclidean distance for the sequential decoder means:

$$K_e = \frac{1}{n}\sum_{k=1}^{m}(r_k - \hat{x}_k)^2$$

where m is the encoded bit sequence length; with a threshold:

$$T_e = \frac{1+\alpha}{N}\sum_{k=1}^{N}(r_k - \hat{x}_k)^2$$

where α is an experimentally determined offset. The idea is that as hard decisions are changed the Euclidean distance between decoded and received sequences increases. If the distance increases at a high rate it can be detected and is indicative of proceeding down a wrong path. If a high rate of increase is detected the decoder takes the same action as it did for the case where ($T_h$) is exceeded under the Hamming approach. If this approach becomes too restrictive, the offset which is considered acceptable can be incremented.

The value of ($T_h$) can be initialized to 1.0 if it is desired to explore all single error events, with increases in ($T_h$) being implemented only when a maximum value of Δ is applied. It is noted, however, that single errors with large Δ may actually be less a problem than double errors with a small Δ. Thus, it can be advantageous to increase the value of ($T_h$) before increasing Δ.

In view of the foregoing, it should be appreciated that there are three parameters which can be varied in controlling the discard criteria, namely:

Δ; ($T_h$); and α.

In the following two present invention application scenarios are discussed, namely Breadth First and Depth First. In the Depth First approach the complexity depends almost completely on the number of symbol decodings that take place during a packet decoding. For a Breadth First approach, two major factors affect the complexity. The first is the average number of decodings that take place during the decoding of a packet, which remains less than M times the number of symbols in a given packet. The second factor is the sorting that takes place before an expansion at a branch point.

With the foregoing in mind, additional comments are appropriate regarding two distinguished approaches to Decoding, (ie. Breadth First and Depth First).

Breadth First Criteria

Applying the Breadth First approach, involves fixing the size of the null zone prior to decoding. It is desirable to keep the null zone small to reduce the number of branch points, and hence the amount of computation, small. At the same time it is necessary to utilize a null zone sufficiently large that the probability of missing an error is below what it is determined can be tolerated. Assuming an AWGN channel with a known SNR, Δ can be selected as:

$$\Delta(p, q) = \frac{Q^{-1}\left(1 - (1 - q)^{\frac{1}{m}}\right)}{Q^{-1}(p)} - 1.$$

where m is the number of bits per packet, p is the channel error probability, and q is the desired lower bound on packet decoding rate. The function Q is given by:

$$Q(x) = \int_x^{\infty} \frac{1}{\sqrt{2\pi}} e^{-\frac{y^2}{2}} dy.$$

For this value of Δ the average number of branch points can be calculated as:

$$B(p, q) = m \int_{(1-\eta)Q^{-1}(p)}^{(1+\eta)Q^{-1}(p)} \frac{1}{\sqrt{2\pi}} e^{-\frac{y^2}{2}} dy. \quad (2)$$

which simplifies to:

$$B(p, q) = m[Q((1-\eta)Q^{-1}(p)) - Q((1+\eta)Q^{-1}(p))] \quad (3)$$

where η=Δ(p,q) and m is the average number of bits per packet. In this implementation, detection of the error detection symbol by the decoder is used to prune the code tree, and the Euclidean distance between the decoded and received sequence is used for selecting the best M paths. However, picking the value of M involves tradeoffs with larger values of M increasing the probability that a correct path will be discarded. The solution adopted was to first perform decoding using a small value of M. If this does not result in successful decoding then M is increased by a value $M_{inc}$ and the procedure is repeated. Said procedure is repeated until the packet is decoded or a predetermined threshold $M_{max}$ is reached, at which point a decoding error is declared.

Figure 1B:
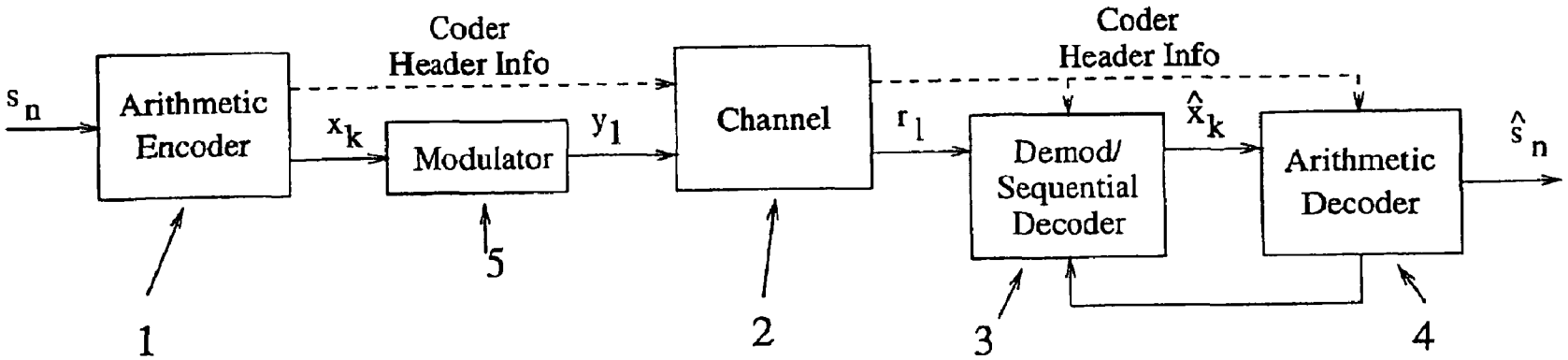
FIG. 1b demonstrates a present invention system which is similar to that shown in FIG. 1a, but which is modified to emphasize application in practice of a parallel decoding scheme.

It is further noted, in the context of a Breadth First approach, that knowing the Modulation Technique applied can allow determination of Specifc Bistable Elements in a Sequential Decoder means which serve as fixed "Branch Points". FIG. 1b demonstrates a present invention system applied to practice a method based in the alluded to approach. FIG. 1b is much like FIG. 1a, but note that a Modulator (5) is specifically shown present between the Arithmetic Encoder (1) and Channel (2), and that the Sequential Decoder of FIG. 1a is identified as further comprising a Demodulator (Demod). Note also that a binary bit stream ($x_k$) enters Modulator (5), but that a modulated binary bit stream ($y_1$) enters the Channel (2) with the sequential signals entered to the Demod/Sequential Decoder being identified by ($r_1$), rather than ($x_k$). It is not felt necessary to provide additional Figures to aide with understanding of the effects of this. Rather, referral to FIGS. 3-5 shows that various series of sequential bits result where bits are changed at various Bistable Element "Branch Points", and said various series of sequential bits can be demonstrated as Branches of a Tree. It is possible to, when an error is determined by detection of the presence of an unexpected, or the absence of an expected encoded reserved symbol by an Arithmetic Decoder means, to form a plurality of possible series(es) of sequential bits, followed by:

selection being made of a series of sequential bits, said selection being made from a group consisting of a plurality of such series of sequential bits which result from the changing of bistable elements in said sequential decoder means, (ie. the various branches of a Tree).

Of course the selected series of sequential bits will be determined by at least one criteria being met, said criteria being for instance:

a. any series of sequential bits which contains an encoded reserved symbol is eliminated;

b. a metric is applied to at least two series of sequential bits which do not contain an encoded reserved sysbol, to the end that determination is made regarding which of said at least two series of sequential bits is most likely correct;

c. an Euclidean metric is applied to at least two series of sequential bits which do not contain an encoded reserved sysbol, to the end that determination is made regarding which of said at least two series of sequential bits is most likely correct. Where this approach is embodied, a suitable decoder, (ideal for use with system which utilizes Trellis Coded Modulation (TCM)), is a List Viterbi decoder where the size of the list can be adjusted to provide increased error protection, with, of course, increased complexity. The Kozintsev et al. article titled "Image Transmission Using Arithmetic Coding Based on Continuous Error Detection", which was cited in the Background Section, it is noted, reported utilizing arithmetic coding for additional error correction in a primarily serially concatenated inner convolutional code scheme. Kozintsev et al., however, did not suggest abandoning punctured convolutional codes as the basis of the bulk of their error correction methodology.

Depth First Criteria

To implement the Depth First approach the parameters required are:

initial value of the null zone $\Delta$ ;

the value by which the null zone is to be incremented $\Delta_{inc}$;

the "backtrack" distance $L_{nz}$;

the threshold to be used to prune ($T_h$); and the parameter a to be used in constructing a threshold for Euclidean distance.

It has been found useful to define two thresholds $T_{h,t}$ and $T_{h,w}$ for Hamming distance and two thresholds $\alpha_t$ and $\alpha_w$ for the Euclidean distance. The total Hamming distance between the decoded sequence and the sequence obtained by hard decision decoding to the threshold $T_{h,t}$ as previously described. The Hamming distance between the decoded sequence on the code Tree and the sequence obtained by hard decision decoding in a sliding window of size $L_w$ to the threshold $T_{h,w}$. The end point of the sliding window is the current bit. A similar procedure is used for the Euclidean distance. It is noted that the values of $T_{h,\ t}$ and $T_{h,w}$ are obtained using two estimates of channel noise variance, one for the entire received sequence $\sigma_t^2$, and one for the sliding window of size $L_w$. The variance $\sigma_t^2$ is translated into a channel probability error "p", and the two thresholds are obtained as:

$$T_{h,t}=np(1+4\sigma_t),\ T_{h,w}=L_w p(1+8\sigma_w)$$

In a specific case, the length of the sliding window $L_w$ was set to 50, and both the $T_h$ parameters were set to a minimum default value of 2. The $T_e$ parameters were found by hard decision decoding to produce X and then setting the $\alpha_t$ and $\alpha_w$ to 0.2 and 2.0 respectively. The value of $\Delta$ was initially set to $0.10\sqrt{E_s}$. When the decoder backtracked a symbol distance of $L_{nz}$=5, the value of $\Delta$ was increased by $\Delta_{inc}=0.10\sqrt{E_s}$ to a maximum of $0.70\sqrt{E_s}$. If the decoder backtracked to the root of the code Tree, the values of $T_{h,t}$ and $T_{e,t}$ (where:

$$T_{e,w}=\frac{(1+0.2)}{N}\sum_{N}(r_k-x_k)^2+T_{e,t}=\frac{(1+0.2)}{L_w}\sum_{L_w}((k-x_k)^2)$$

were increased by 10% and the values of $T_{h,w}$ and $T_{e,w}$ were increased by 20%.

Computational effort was determined by computing the ratio of the total number of decode operations performed by the decoder to the number of symbols transmitted. In the case where no errors occurred this ratio is one. When an error is detected, because of backtracks, the decoding scheme requires more decode operations than the number of symbols transmitted resulting in a value greater than one. When said ratio exceeded $10^3$ a decoding failure was declared.

Figure 8A:
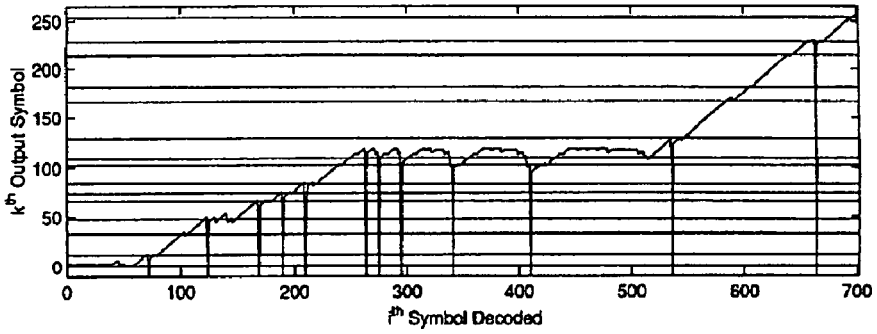
FIG. 8a plots the number of symbols decoded vs. the number of decode operations, with the horizontal lines represent the locations of the errors and the downward spikes indicate when the null zone is expanded for a present invention system application.
Figure 8B:
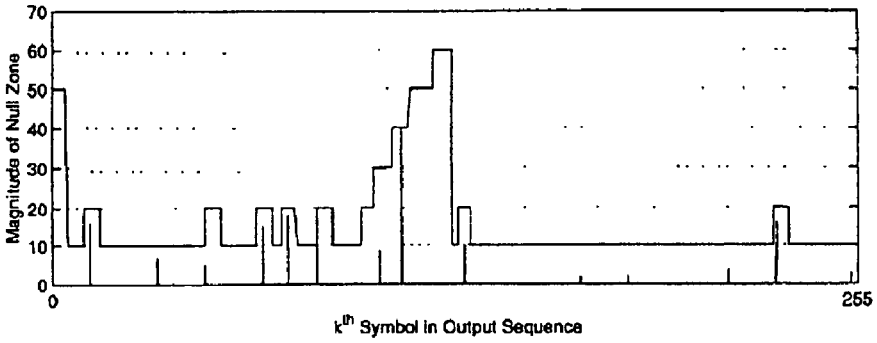
FIG. 8b shows the final magnitude of the null zone denoted by the solid "stair step" line, showing the error locations and magnitudes.

FIGS. 8a and 8b present an example of the progression of the decoding procedure. FIG. 8a plots the number of symbols decoded vs. the number of decode operations. The horizontal lines represent the locations of the errors and the downward spikes indicate when the null zone is expanded. The trace progresses upward in a linear fashion until an error is detected. At that point the decoder backtracks. The is indicated by the downward slope of the decode trace. The trace continues downward until a branch point is reached. Then the trace slopes upward once again until another error is detected or the sequence is terminated. Note that there can be a lot of "jostling" around the errors until the correct branch point is found. Also note that the null zone is only expanded when the progression backtracks for a symbol distance of $L_{nz}$. FIG. 8b shows the final magnitude of the null zone denoted by the solid "stair step" line. Also shown are the error locations and magnitudes. These are the peaks along the bottom. To obtain a correct decoding, the null zone region must be expanded to encompass all the introduced errors.

Table 1 presents the results of using the depth first decoding approach in terms of packet recovery rates for the four different values of the error detection space:

($\epsilon$=0.5, 0.29, 0.16, 0.08).

TABLE 1

Packet Recovery Rates for Depth First Decoding

| | $p_c=10^{-1.5}$ | $p_c=10^{-2.0}$ | $p_c=10^{-2.5}$ | $p_c=10^{-3.0}$ |
|---|---|---|---|---|
| NONE | 0.00 | 0.00 | 0.01 | 24.64 |
| $\epsilon$ = 0.08 | 0.00 | 0.39 | 46.63 | 96.72 |
| $\epsilon$ = 0.16 | 0.00 | 17.04 | 95.94 | 99.17 |
| $\epsilon$ = 0.29 | 0.00 | 71.09 | 99.21 | 99.56 |
| $\epsilon$ = 0.50 | 0.19 | 88.23 | 99.51 | 99.66 |

For comparison, also included is the case where the standard arithmetic encoder is used, albeit with packetization. The results show a more than 99% recovery rate for $\epsilon$=0.16, 0.29, and 0.5; at a channel error rate of $10^{-3}$ Similarly high results hold for $\epsilon$=0.29 and 0.5 for $p_c=10^{-2.5}$; where $p_e$ is the probability of error for a symbol being transmitted over the channel.

However, for higher error rates the recovery rates drop significantly. Note that for a given channel error probability the amount of error space that is used is inversely proportional to the probability of packet loss.

To implement the Breadth First approach various parameter values were selected as follows: M=200, $M_{inc}$=1800, and $M_{max}$=2000. $\Delta$ was chosen to be {1.20, 1.00, 0.91, 0.82} for channel error probabilities of $\{10^{-15}, 10^{-2}, 10^{-2.5}, 10^{-3}\}$, respectively. The parameters used give the lower bounds on packet loss rates of $\{10^{-1.5}10^{-3}, 10^{-4}, 10^{-5}\}$, respectively. It should be recalled that he algorithm functions by first listing all possible paths at a branch point, then pruning all but the M which are closest in Euclidean distance, to the received sequence. Between the branch point paths get pruned because progressing along them results in the decoding of the error of the detection space.

Figure 9:
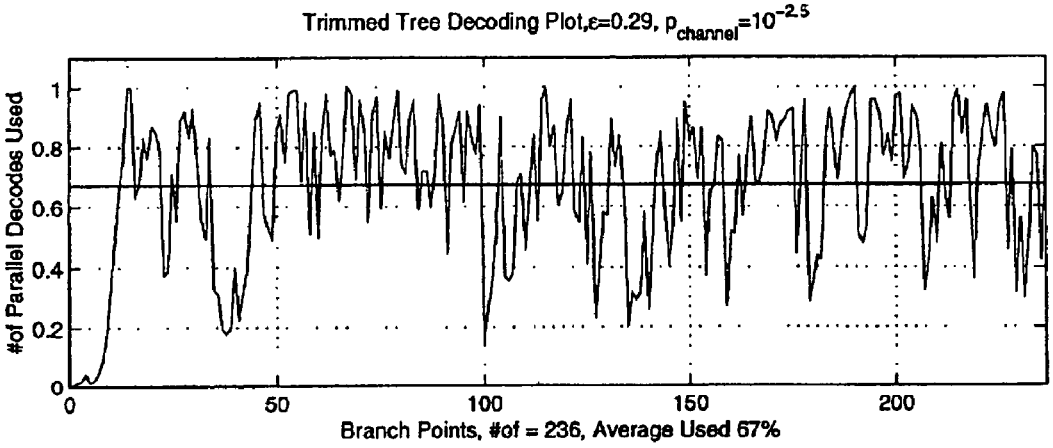
FIG. 9 shows a plot of the fraction of paths that have not been pruned at each point for an application of a present invention scheme.
Figure 10A:
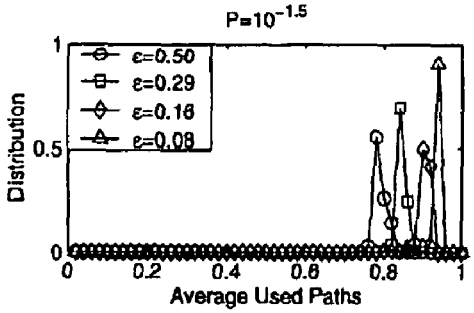
FIGS. 10a, 10b, 10c and 10d show how the decrease in the channel error probability, and corresponding drop in number of branch points, affects the required number of parallel decodings.
Figure 10B:
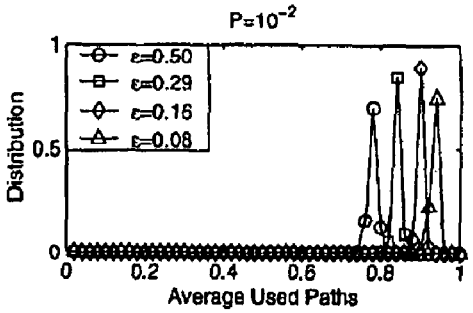
Figure 10C:
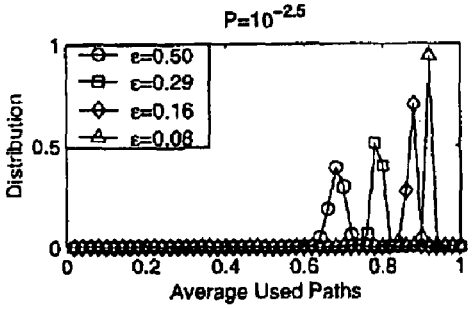
Figure 10D:
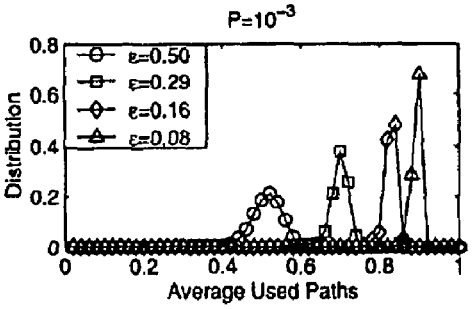

FIG. 9 shows a plot of the fraction of paths that have not been pruned at each point. The average fraction of parallel decodings used is also indicated on FIG. 9 by the horizontal line. Note that more than half of the M paths are valid when a branch point is reached, the number of branches after the point is greater than M. The algorithm will then prune the paths furthest from the received sequence. If the valid path is ever pruned, the sequence will not decode at all or, with a small probability, it will decode incorrectly.

FIGS. 10a, 10b, 10c and 10d show how the decrease in the channel error probability, and corresponding drop in number of branch points, affects the required number of parallel decodings. Also note that the histogram for $\epsilon$=0.5 shifts quite significantly, dropping to around 50%. However, the distribution for $\epsilon$=0.08 is concatenated on the left and the reduction on branch points has little effect. Using M=200 to decode the packet results in being unable to decode the packet, hence the value of M was increased to 2000. If thereafter the packet could still not be decoded, a decoding failure was declared. For channel error probabilities of $10^{-3}$ and $10^{-2.5}$ a higher number of paths was used for less than one packet in 20,000 for all values of the error detection space. For a channel error probability of $10^{-2}$ the same result held for $\epsilon$=0.5 and $\epsilon$=0.29. For $\epsilon$=0.16 the higher number of paths was used for about 20% of the packets and about 7% of the packets could not be decoded even with the higher number of paths. The situation was significantly worse for $\epsilon$=0.08 with only 20% of the packets decoded using M=200. For a channel error rate of $10^{-1.5}$ and $\epsilon$=0.5, a little more that 20% of the packets were decoded using M=200 while about 50% of the packets were decoded with M=2000. For other values of almost all the packets that could be recovered required M=2000.

Table 2 presents recovery rates for the case where Breadth First decoding was applied.

TABLE 2

Packet Recovery Rates for Breadth First Decoding

| | $p_c = 10^{-1.5}$ | $p_c = 10^{-2.0}$ | $p_c = 10^{-2.5}$ | $p_c = 10^{-3.0}$ |
|---|---|---|---|---|
| NONE | 0.00 | 0.00 | 0.01 | 24.64 |
| $\epsilon$ = 0.08 | 0.00 | 38.53 | 99.89 | 99.99 |
| $\epsilon$ = 0.16 | 0.00 | 92.03 | 99.94 | 99.99 |
| $\epsilon$ = 0.29 | 16.63 | 99.30 | 99.95 | 99.99 |
| $\epsilon$ = 0.50 | 73.24 | 99.33 | 99.95 | 99.99 |

The recovers rate is greater than 99% for all values of c for channel probabilities of error of $10^{-2.5}$ and $10^{-3.0}$. For $p_e=10^{-2}$ the recovery rate is still greater than 99% for $\epsilon$=0.29 and 0.5. For $p_c=10^{-1.5}$ a recovery rate of 73% of the packets for $\epsilon$=0.50 may still be useful for some applications. Notice that at higher error rates the Breadth first approach substantially out-performs the Depth First approach. A penalty is paid for this performance at lower error rates, however, where the computational cost of the Breadth First approach is higher than the Depth First approach.

Finally, performance of the present invention Joint Source Channel Coding Strategy is compared to that of three conventional schemes:

(4/5) convolutional codes, (one with 16 states and one with 8 states); and (223,255) Reed Solomon Code.

All these schemes have approximately the same rate overhead (the exact number of information bits per data bit are shown in Table 3).

TABLE 3

Coding Rates

| | Rate $\frac{\text{information bits}}{\text{data bits}}$ |
|---|---|
| NONE | 1.000 |
| $\epsilon$ = 0.29 | 0.901 |
| $\epsilon$ = 0.50 | 0.819 |
| (223, 255) RS | 0.875 |
| 4/5 Conv, s = 8 | 0.800 |
| 4/5 Conv, s = 16 | 0.800 |

Figure 11:
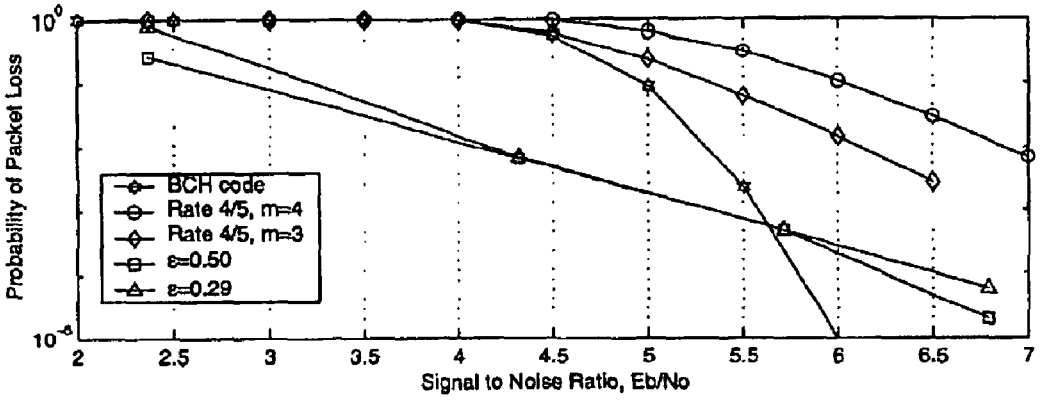
FIG. 11 shows comparison of the present invention Joint Source Channel Coding Strategy to three conventional schemes, namely (4/5) convolutional codes, (one with 16 states and one with 8 states); and (223,255) Reed Solomon Code.

The performances of the identified schemes is plotted in FIG. 11. Said schemes are assumed to have the same header protection. Note that FIG. 11 shows that the packet loss rat for two convolutional cases noted are considerably worse over the simulated range. Also note that the Reed Solomon code performs worse for low signal to noise ratios (SNR), but when the SNR increases to around 5.625, the Reed Solomon marginally out-performs the present invention approach. The SNR's used in the simulations were:

{2.368, 4.323, 5.714, 6.790} decibels.

Continuing, the amount of redundancy indicated in Table 3 shows that the convolutional codes have the highest amount thereof, followed by the present invention scheme with $\epsilon$=0/5. The present invention scheme with $\epsilon$=0.29 has the lowest amount of added redundancy of the schemes compared. It should be specifically appreciated that the present invention algorithm is only slightly more complex than a standard Arithmetic encoding scheme, with the added complexity being present primarily at the decoder.

In the Depth First approach the complexity depends almost completely on the number of symbol decodings that take place during a packet decoding, hence the complexity is slightly more than the average number of symbol decodings for a given SNR.

As alluded to earlier, for a Breadth First approach, two major factors affect the complexity. The first is the average number of decodings that take place during the decoding of a packet, which remains less than M times the number of symbols in a given packet. The averages can be seen in FIG. 11. The second factor is the sorting that takes place before an expansion at a branch point. The average number of branch points can be calculated using Equation 3. At each branch point there exists the possibility of needing to sort if the number of current paths is more than half of the maximum. The complexity of the sort in the decoding used is $M\log_2(M)$. Thus, there is a large linear dependence, and an M log(M) dependence in the decoding complexity.

Present invention schemes provide substantial packet recovery rates at channel rates as low as $10^{-1.5}$ with low coding overhead. Such schemes are useful in hostile communication environments where minimal coding overhead is advantageous. The approach may be especially useful for mobile and wireless applications.

The present invention can be applied in communication systems which operate based on Binary Phase Shift Keying (BPSK), Quadrature Phase Shift Keying (QPSK) and Trellis Coded Modulation (TCM) etc.

It is noted that the terminology "variable length" refers to the length of code words assigned to input symbols, and the "joint source-channel symbol encoding" refers the use of the same encoding means to encode "allowed alphabetic symbols" and "non-alphabet symbols" for use in error correction.

Finally, it is noted that the present invention is primarily useful when applied with variable length symbol coding methods. For example Huffman coding provides coding more probably symbols with shorter bit sequences. Arithmetic encoders code strings of symbols in a sequence of bits, and Claim language structure is focused to apply thereto.

Having hereby disclosed the subject matter of the present invention, it should be obvious that many modifications, substitutions, and variations of the present invention are possible in view of the teachings. It is therefore to be understood that the invention may be practiced other than as specifically described, and should be limited in its breadth and scope only by the Claims.

We claim:

1. A variable length symbol, joint source-channel encoding, symbol decoding and error correction system comprising:

encoder system;

modulation-transmission means; and combination sequential, and encoded symbol, decoding systems;

said encoder system comprising input means for accepting a sequential plurality of allowed input symbols and output means for outputting an encoded sequence of bits for allowed symbols input thereinto;

said encoder system being functionally interconnected to said modulation-transmission means such that entry of a symbol to said encoder system results in said encoder means outputting an encoded sequence of bits therefore into said modulation-transmission means;

said modulation-transmission means and combination sequential, and encoded symbol, decoding systems being functionally interconnected such that an encoded symbol sequence of bits entered to said modulation-transmission means enters said combination sequential, and encoded symbol, decoding systems;

said sequential decoding system comprising a plurality of bistable elements;

said encoded symbol decoding system comprising means for initiating an error correction routine to the end that, upon the detecting of the presence of an unexpected encoded reserved symbol a selection from the group consisting of:

at least one bistable element in said sequential decoding means is changed; and selection is made of a series of sequential bits, said selection being made from a group consisting of a plurality of such series of sequential bits which result from the changing of bistable elements in said sequential decoder means;

is performed;

wherein said reserved symbol is not allowed as an input symbol to said symbol encoder system input means, and wherein the detection of the presence of an encoded allowed symbol by said encoded symbol decoding system does not initiate said error correction routine.

2. A variable length symbol joint source-channel encoding, symbol decoding and error correction system comprising:

encoder means;

modulation-transmission means; and combination sequential, and encoded symbol, decoding means;

said encoder means comprising input means for accepting a sequential plurality of allowed input symbols and output means for outputting an encoded sequence of bits for allowed symbols input thereinto;

said encoder means further having means for generating, and in a sequence expected by said encoded symbol decoding means, outputting an encoded sequence of bits for at least one reserved symbol before and/or after an encoded allowed input symbol, which reserved symbol is not allowed as an input symbol to said encoder means input means;

said encoder means being functionally interconnected to said modulation-transmission means such that entry of a symbol to said encoder means results in said encoder means outputting an encoded sequence of bits therefore into said modulation-transmission means;

said modulation-transmission means and combination sequential, and encoded symbol, decoding means being functionally interconnected such that an encoded symbol sequence of bits entered to said modulation-transmission means enters said encoded symbol decoding means;

said sequential decoding means comprising a plurality of bistable elements;

said encoded symbol decoding means comprising means for initiating an error correction routine to the end that, upon the detecting of the presence of an unexpected encoded reserved symbol, or the absence of an expected encoded sequence of bits for a reserved symbol, a selection from the group consisting of:

at least one bistable element in said sequential decoding means is changed; and selection is made of a series of sequential bits, said selection being made from a group consisting of a plurality of such series of sequential bits which result from the changing of bistable elements in said sequential decoder means;

is performed;

and wherein the detection of the presence of an encoded allowed symbol, other than by its coincidental presence in the place of an absent expected reserved symbol, by said encoded symbol decoding means, does not initiate said error correction routine.

3. A joint source-channel encoding, symbol decoding and error correction system comprising:

encoder means;

modulation-transmission means; and decoding means;

wherein said encoder means comprises input means for accepting a sequential plurality of allowed input symbols and output means for outputting an encoded sequence of bits for allowed symbols input thereinto;

wherein said decoding means comprises a functional combination of a sequential decoder means which comprises a sequence of bistable elements, each of which can be set to represent encoded symbol bits, and an encoded symbol decoder means;

said encoder means being functionally interconnected to said modulation-transmission means and said modulation-transmission means being functionally interconnected to said decoding means;

such that in use said encoder means receives a sequence of allowed symbols at its input means and provides an encoded sequence of bits for at least some thereof, said sequence of bits being caused to arrive at said decoding means;

and said encoded symbol decoder means having error detection means such that in use said encoded symbol decoder means, upon detecting the presence of an unexpected encoded sequence of bits for reserved symbol, initiates an error correction routine to the end that a selection from the group consisting of:

at least one bistable element in said sequential [encoding] *decoder* means is changed; and selection is made of a series of sequential bits, said selection being made from a group consisting of aplurality of such series of sequential bits which result from the changing of bistable elements in said sequential decoder means;

is performed;

wherein said reserved symbol is not allowed as an input symbol to said encoder means input means, and wherein the detecting of the presence of an encoded allowed symbol by said decoding means does not initiate said error correction routine.

4. A joint source-channel encoding, symbol decoding and error correction system as in claim 3 in which said encoder means is an arithmetic encoder and said decoding means comprises, as the encoded symbol decoder means, an arithmetic decoder.

5. A joint source-channel encoding, symbol decoding and error correction system comprising:

encoder means;

modulation-transmission means; and decoding means;

wherein said decoding means comprises a functional combination of a sequential decoder means which comprises a sequence of bistable elements, each of which can be set to represent encoded symbol bits, and an encoded symbol decoder means;

wherein said encoder means comprises input means for accepting a sequential plurality of allowed input symbols and output means for outputting an encoded sequence of bits for allowed symbols input thereinto, said encoder means further having means for generating and, in a sequence expected by said encoded symbol decoder means, outputting an encoded sequence of bits for at least one reserved symbol before and/or after an encoded allowed input symbol, which reserved symbol is not allowed as an input symbol to said encoder means input means;

said encoder means being functionally interconnected to said modulation-transmission means and said modulation-transmission means being functionally interconnected to said decoding means;

such that in use said encoder means receives a sequence of allowed symbols at its input means and provides an encoded sequence of bits for at least some thereof in optional combination with a sequence of bits which represent at least one encoded reserved symbol in a pattern expected by said decoder means, said sequence of bits being caused to arrive at said decoding means;

and said encoded symbol decoder means having error detection means such that in use said encoded symbol decoder means, upon detecting the absence of an expected encoded reserved symbol, or the presence of an unexpected encoded reserved symbol, initiates an error correction routine to the end that a selection from the group consisting of:

at least one bistable element in said sequential decoding means is changed; and selection is made of a series of sequential bits, said selection being made from a group consisting of a plurality of such series of sequential bits which result from the changing of bistable elements in said sequential decoder means;

is performed;

and wherein the detection of the presence of an encoded allowed symbol, other than by its coincidental presence in the place of an absent expected reserved symbol, by said decoding means, does not initiate said error correction routine.

6. A joint source-channel encoding, symbol decoding and error correction system as in claim 5 in which said encoder means is an arithmetic encoder and said decoding means comprises, as the encoded symbol decoder means, an arithmetic decoder.

7. A joint source-channel encoding, symbol decoding and error correction system comprising:

arithmetic encoder system;

modulation-transmission means; and decoding system;

wherein said arithmetic encoder system comprises input means for accepting a sequential plurality of allowed input symbols and output means for outputting an encoded sequence of bits for allowed symbols input therein to;

wherein said decoding system comprises a functional combination of a sequential decoder system which comprises a sequence of bistable elements, each of which can be set to represent encoded symbol bits, and an arithmetic decoder system;

said arithmetic encoder system being functionally interconnected to said modulation-transmission means and said modulation-transmission means being functionally interconnected to said decoding system;

such that in use said arithmetic encoder system receives a sequence of allowed symbols at its input means and provides an encoded sequence of bits for at least some thereof, said sequence of bits being caused to arrive at said decoding system;

and said arithmetic decoder system having error detection means such that in use said arithmetic decoder system, upon detecting the presence of an unexpected encoded reserved symbol, initiates an error correction routine to the end that a selection from the group, consisting of:

at least one bistable element in said sequential [encoding means] *decoder system* is changed; and selection is made of a series of sequential bits, said selection being made from a group consisting of a plurality of such series of sequential bits which result from the changing of bistable elements in said sequential [decoder means] *decoder system*;

is performed;

wherein said reserved symbol is not allowed as an input symbol to said arithmetic encoder system input means, and wherein the detecting of the presence of an encoded allowed symbol by said decoding system does not initiate said error correction routine.

8. A joint source-channel encoding, symbol decoding and error correction system comprising:

arithmetic encoder means;

modulation-transmission means; an decoding means;

wherein said decoding means comprises a functional combination of a sequential decoder means which comprises a sequence of bistable elements, each of which can be set to represent encoded symbol bits, and an arithmetic decoder means;

wherein said arithmetic encoder means comprises input means for accepting a sequential plurality of allowed input symbols and output means for outputting an encoded sequence of bits for allowed symbols input thereinto, said arithmetic encoder means further having means for generating and, in a sequence expected by said arithmetic decoder means, outputting an encoded sequence of bits for at least one reserved symbol before and/or after an encoded allowed input symbol, which reserved symbol is not allowed as an input symbol to said arithmetic encoder means input means;

said arithmetic encoder means being functionally interconnected to said modulation-transmission means and said modulation-transmission means being functionally interconnected to said decoding means;

such that in use said arithmetic encoder means receives a sequence of allowed symbols at its input means and provides an encoded sequence of bits for at least some thereof in optional combination with at least one encoded reserved symbol in a pattern expected by said arithmetic decoder means, said sequence of bits being caused to arrive at said decoding means;

and said arithmetic decoder means having error detection means such that in use said arithmetic decoder means, upon detecting the absence of an expected encoded reserved symbol, or the presence of an unexpected encoded reserved symbol, initiates an error correction routine to the end that a selection from the group consisting of:

at least one bistable element in said sequential decoding means is changed; and selection is made of a series of sequential bits, said selection being made from a group consisting of a plurality of such series of sequential bits which result from the changing of bistable elements in said sequential decoder means;

is performed;

and wherein the detection of the presence of an encoded allowed symbol, other than by its coincidental presence in the place of an absent expected reserved symbol, by said decoding means, does not initiate said error correction routine.

9. A method of correcting errors in decoded symbols which are encoded by an encoder means in a joint source-channel coding system, comprising the steps of:

a. providing a joint source-channel encoding, symbol decoding and error correction system comprising:
encoder means;
modulation-transmission means; and
decoding means;

wherein said decoding means comprises a functional combination of a sequential decoder means which comprises a sequence of bistable elements, each of which can be set to represent encoded symbol bits, and an encoded symbol decoder means;

wherein said encoder means comprises input means for accepting a sequential plurality of allowed input symbols and output means for outputting an encoded sequence of bits for allowed symbols input thereinto, said encoder means further having means for generating and, in a sequence expected by said encoded symbol decoder means, outputting an encoded sequence of bits for at least one reserved symbol before and/or after an encoded allowed input symbol, which reserved symbol is not allowed as an input symbol to said encoder means input means;

said encoder means being functionally interconnected to said modulation-transmission means and said modulation-transmission means being functionally interconnected to said decoding means;

such that in use said encoder means receives a sequence of allowed symbols at its input means and provides an encoded sequence of bits for at least some thereof, in optional combination with at least one encoded reserved symbol in a pattern expected by said decoder means, said sequence of bits being caused to arrive at said decoding means;

and said encoded symbol decoder means having error detection means such that in use said encoded symbol decoder means, upon detecting the absence of an expected encoded reserved symbol, or the presence of an unexpected encoded reserved symbol, initiates an error correction routine to the end that a selection from the group consisting of:

at least one bistable element in said sequential decoding means is changed; and selection is made of a series of sequential bits, said selection being made from a group consisting of a plurality of such series of sequential bits which result from the changing of bistable elements in said sequential decoder means;

is performed;

wherein the detection of the presence of an encoded allowed symbol, other than by its coincidental presence in th place of an absent expected reserved symbol, by said decoding means, does not initiate said error correction routine;

b. inputting a plurality of symbols to the input means of said encoder means;

c. causing said encoder means to encode at least some of said plurality of symbols and output bits corresponding thereto into said modulation-transmission means;

d. causing said modulation-transmission means to enter said at least some of said plurality of encoded symbols into said functional combination of said sequential decoder means and encoded symbol decoder means;

e. causing said encoded symbol decoder means to, if detecting a present unexpected or absent expected, encoded reserved symbol, perform a selection from the group consisting of:

change at least one bistable element in said sequential decoder means; and select a series of sequential bits, said selection being made from a group consisting of a plurality of such series of sequential bits which result from the changing of bistable elements in said sequential decoder means.

10. A method as in claim 9, wherein said encoded reserved symbol is selected from a group of at least two reserved symbols, and wherein at least two different expected reserve symbols are selected and entered into said modulation-transmission means.

11. A method of correcting errors in decoded symbols which are encoded by an arithmetic encoder in a joint source-channel coding system, comprising the steps of:

a. providing a joint source-channel encoding, symbol decoding and error correction system comprising:
arithmetic encoder means;
modulation-transmission means; and
decoding means;

wherein said arithmetic encoder means comprises input means for accepting a sequential plurality of allowed input symbols and output means for outputting an encoded sequence of bits for allowed symbols input thereinto;

wherein said decoding means comprises a functional combination of a sequential decoder means which comprises a sequence of bistable elements, each of which can be set to represent encoded symbol bits, and an arithmetic decoder means;

said arithmetic encoder means being functionally interconnected to said modulation-transmission means and said modulation-transmission means being functionally interconnected to said decoding means;

such that in use said arithmetic encoder means receives a sequence of allowed symbols at its input means and provides an encoded sequence of bits for at least some thereof, said sequence of bits being caused to arrive at said decoding means;

and said arithmetic decoder means having error detection means such that in use said arithmetic decoder means, upon detecting the presence of an unexpected encoded reserved symbol, initiates an error correction routine to the end that a selection from the group consisting of:

at least one bistable element in said sequential decoding means is changed; and selection is made of a series of sequential bits, said selection being made from a group consisting of a plurality of such series of sequential bits which result from the changing of bistable elements in said sequential decoder means;

is performed;

wherein said reserved symbol is not allowed as an input symbol to said arithmetic encoder means input means, and wherein the detection of the presence of an allowed encoded symbol by said decoding means does not initiate said error correction routine;

b. inputting a plurality of symbols to the input means of said arithmetic encoder means;

c. causing said arithmetic encoder means to encode at least some of said plurality of symbols and output bits corresponding thereto into said modulation-transmission means;

d. causing said modulation-transmission means to enter said at least some of said plurality of encoded symbols into said functional combination of said sequential decoder means and arithmetic decoder means;

e. causing said arithmetic decoder means to, if detecting a present unexpected encoded reserved symbol perform a selection from the group consisting of:

change at least one bistable element in said sequential decoder means; and select a series of sequential bits, said selection being made from a group consisting of a plurality of such series of sequential bits which result from the changing of bistable elements in said sequential decoder means.

12. A method as in claim 11, wherein said encoded reserved symbol is selected from a group of at least two reserved symbols.

13. A method of correcting errors in decoded symbols which are encoded by an arithmetic encoder in a joint source-channel coding system, comprising the steps of:

a. providing a joint source-channel encoding, symbol decoding and error correction system comprising:
arithmetic encoder means;
modulation-transmission means; and
decoding means;

wherein said decoding means comprises a functional combination of a sequential decoder means which comprises a sequence of bistable elements, each of which can be set to represent encoded symbol bits, and an arithmetic decoder means;

wherein said arithmetic encoder means comprises input means for accepting a sequential plurality of allowed input symbols and output means for outputting an encoded sequence of bits for allowed symbols input thereinto, said arithmetic encoder means further having means for generating and, in a sequence expected by said arithmetic decoder means, outputting an encoded sequence of bits for at least one reserved symbol before and/or after an allowed input symbol, which reserved symbol is not allowed as an input symbol to said arithmetic encoder means input means;

said arithmetic encoder means being functionally interconnected to said modulation-transmission means and said modulation-transmission means being functionally interconnected to said decoding means;

such that in use said arithmetic encoder means receives a sequence of allowed symbols at its input means and provides an encoded sequence of bits for at least some thereof in optional combination with at least one encoded reserved symbol in a pattern expected by said arithmetic decoder means, said sequence of bits being caused to arrive at said decoding means;

and said arithmetic decoder means having error detection means such that in use said arithmetic decoder means, upon detecting the absence of an expected encoded reserved symbol, or the presence of an unexpected encoded reserved symbol, initiates an error correction routine to the end that a selection from the group consisting of:

at least one bistable element in said sequential decoding means is changed; and selection is made of a series of sequential bits, said selection being made from a group consisting of a plurality of such series of sequential bits which result from the changing of bistable elements in said sequential decoder means;

is performed;

wherein said reserved symbol is not allowed as an input symbol to said arithmetic encoder means input means and wherein the detection of the presence of an allowed symbol, other than by its coincidental presence in the place of an absent expected encoded reserved symbol, by said decoding means, does not initiate said error correction routine;

b. inputting a plurality of symbols to the input means of said arithmetic encoder means;

c. causing said arithmetic encoder means to encode at least some of said plurality of symbols and output bits corresponding thereto, optionally intermingled with arithmetic at least one encoder means generated reserved symbol, into said modulation-transmission means;

d. causing said modulation-transmission means to enter said at least some of said plurality of encoded symbols, optionally along with at least one encoded reserved symbol entered into said modulation-transmission means, into said functional combination of said sequential decoder means and arithmetic decoder means;

e. causing said arithmetic decoder means to, if detecting a non-present expected or present unexpected encoded reserved symbol, perform a selection from the group consisting of:

change at least one bistable element in said sequential decoder means; and select a series of sequential bits, said selection being made from a group consisting of a plurality of such series of sequential bits which result from the changing of bistable elements in said sequential decoder means.

14. A method as in claim 13, wherein said encoded reserved symbol is selected from a group of at least two reserved symbols, and wherein at least two different expected reserve symbols are selected and entered into said modulation-transmission means.

15. A method of correcting errors in decoded symbols which are encoded by an arithmetic encoder in a joint source-channel coding system, comprises the steps of:

a. providing a joint source-channel encoding, symbol decoding and error correction, system comprising:
arithmetic encoder means;
modulation-transmission means; and
decoding means;

wherein said decoding means comprises a functional combination of a sequential decoder means which comprises a sequence of bistable elements, each of which can be set to represent encoded symbol bits, and an arithmetic decoder means;

wherein said arithmetic encoder means comprises input means for accepting a sequential plurality of allowed input symbols and output means for outputting an encoded sequence of bits for allowed symbols input thereinto, said arithmetic encoder means further having means for generating and, in a sequence expected by said arithmetic decoder means, outputting an encoded sequence of bits for at least one reserved symbol before and/or after an encoded allowed input symbol, which reserved symbol is not allowed as an input symbol to said arithmetic encoder means input means;

said arithmetic encoder means being functionally interconnected to said modulation-transmission means and said modulation-transmission means being functionally interconnected to said decoding means;

such that in use said arithmetic encoder means receives a sequence of allowed symbols at its input means and provides an encoded sequence of bits for at least some thereof in optional combination with at least one encoded reserved symbol in a pattern expected by said arithmetic decoder means, said sequence of bits being caused to arrive at said decoding means;

and said arithmetic decoder means having error detection means such that in use said arithmetic decoder means, upon detecting the absence of an expected encoded reserved symbol, or the presence of an unexpected encoded reserved symbol, initiates an error correction routine to the end that at least one bistable element in said sequential decoder means is changed;

b. entering a sequence of symbols into said arithmetic encoder such that said sequence of symbols are encoded and exited therefrom as a binary bit stream sequence of $+x\sqrt{E_8}$ and $-x\sqrt{E_8}$ signals, corresponding to a string of "1"/("0")'s and "0"/("1")'s which pass through said transmission channel and enter said sequential decoder means, where x is a fraction;

c. making hard logic circuitry decisions as to the presence of "1"/("0")'s and "0"/("1")'s based on said binary bit stream sequence of $+x\sqrt{E_s}$ and $-x\sqrt{E_s}$ signals while identify decisions based upon signals wherein x is of a value so as to cause the values of $+x\sqrt{E_s}$ or $-x\sqrt{E_s}$ to be within a null zone of $+\Delta$ to $-\Delta$ around 0,0, and identifying said decisions as "branch point", decisions in said sequential decoder means;

d. monitoring output from said arithmetic decoder for errors and [when] *if* an error is indicated thereby, identifying a "branch point" in said sequential decoder means and correcting the "1"/("0") or "0"/("1") based binary bit thereat by inverting it to "0"/("1") or "1"/("0").

16. A method of correcting errors in decoded symbols as in claim 15, in which in step d. involves the determination of the presence or absence of non-alphabet symbols other than as expected, said non-alphabet symbols being not-allowed as arithmetic encoder input symbols.

17. A method of correcting errors in decoded symbols as in claim 15, which comprises practicing step d. more than once, with said error correcting method further comprising the step of:

e. defining a tolerable Hamming distance threshold Tc, and keeping count of the number Kc of "branch points" in said sequential decoder means at which correction of the "1"/("0") or "0"/("1") based binary bit thereat by inverting to "0"/("1") or "1"/("0") has been performed; and if Kc exceeds Tc, expanding the null zone by increasing the magnitude of $\Delta$, thereby making available additional "branch points".

18. A method of correcting errors in decoded symbols as in claim 17, said error correction method of further comprising the step of:

f. determining in a second or greater practice of step e. if the identified "branch point" is sequentially prior to the "branch point" identified in the immediately previous practice of step e. and if so decreasing the value of Kc by 1, otherwise increasing the value of Kc by 1.

19. A method of correcting errors in decoded symbols as in claim 15, which comprises practicing step d. more than once, with said error correcting method further comprising the step of:

e. defining a means for calculating a Euclidean distance between received and decoded symbols, and a tolerable rate of increase of Euclidean distance between sequential practice of step d., and if said Euclidean distance increases faster than at said tolerable rate, expanding the null zone by increasing he magnitude of $\Delta$, thereby making available additional "branch points".

20. A method of correcting errors in decoded symbols which are encoded by an arithmetic encoder in a joint source-channel coding system, comprises the step of:

a. providing a joint source-channel encoding, symbol decoding and error correction system comprising:

arithmetic encoder means;

modulation-transmission means; and deocding means;

wherein said decoding means comprises a functional combination of a sequential decoder means which comprises a sequence of bistable elements, each of which can be set to represent encoded symbol bits, and an arithmetic decoder means;

specific bistable elements in said sequential decoder means being identified as fixed branch points;

wherein said arithmetic encoder means comprises input means for accepting a sequential plurality of allowed input symbols and output means for outputting an encoded sequence of bits for allowed symbols input thereinto, said arithmetic encoder means further having means for generating and, in a sequence expected by said arithmetic decoder means, outputting an encoded sequence of bits for at least one reserved symbol before and/or after an encoded allowed input symbol, which reserved symbol is not allowed as an input symbol to said arithmetic encoder means input means;

said arithmetic encoder means being functionally interconnected to said modulation-transmission means and said modulation-transmission means being functionally interconnected to said decoding means;

such that in use said arithmetic encoder means receives a sequence of allowed symbols at its input means and provides an encoded sequence of bits for at least some thereof in optional combination with at least one encoded reserved symbol in a pattern expected by said arithmetic decoder means, said sequence of bits being caused to arrive at said decoding means;

and said arithmetic decoder means having error detection means such that in use said arithmetic decoder means, upon detecting the absence of an expected encoded reserved symbol, or the presence of an unexpected encoded reserved symbol, initiates an error correction routine to the end that:

selection is made of a series of sequential bits, said selection being made from a group consisting of a plurality of such series of sequential bits which result from the changing of bistable elements in said sequential decoder means at said specified branch points;

is performed;

b. entering a sequence of symbols into said arithmetic encoder means such that said sequence of symbols are encoded and exited therefrom as a binary bit stream sequence;

c. monitoring output from said arithmetic decoder means for errors;

d. upon detection of an error by said arithmetic decoder means, producing a plurality of series of sequential bits which result from the changing of bistable elements in said sequential decoder means at said branch points by using fixed branch point bistable elements in said sequential decoder means;

e. determining which series of sequential bits in said produced plurality of series of sequential bits is most likely correct utilizing at least one selection from the group consisting of:

1. eliminating any series of sequential bits which contains an encoded reserved symbol;

2. applying a metric to at least two series of sequential bits which do not contain an encoded reserved symbol, to determine which of said at least two series of sequential bits is most likely correct;

3. applying an Euclidean metric to at least two series of sequential bits which do not contain an encoded reserved symbol, to determine which of said at least two series of sequential bits is most likely correct.

*21. A system, comprising:*

*a decoder, comprising an arithmetic decoder and a sequential decoder, configured to receive data from an arithmetic encoder via a channel,*

*wherein the arithmetic decoder, upon detecting an absence of an expected encoded reserved symbol or a presence of an unexpected encoded reserved symbol, is configured to initiate an error correction routine,*

*wherein the arithmetic decoder is configured to not initiate the error correction routine upon detection of an allowed symbol in the received data, and*

*wherein the sequential decoder is configured to, upon initiation of the error correction routine by the arithmetic decoder, change at least one bistable element in the sequential decoder or select a series of sequential bits from a plurality of series of sequential bits which result from the changing of bistable elements in the sequential decoder.*

*22. The system of claim 21, further comprising:*

*the arithmetic encoder configured to receive input data; and*

*a modulator located between the arithmetic encoder and the channel.*

*23. The system of claim 21, wherein the decoder is configured for use in a communication system.*

*24. The system of claim 23, wherein the communication system is configured to use Binary Phase Shift Keying (BPSK), Quadrature Phase Shift Keying (QPSK), or Trellis Coded Modulation (TCM).*

*25. A method, comprising:*

*receiving data from an encoder via a channel at a decoder, the decoder comprising an arithmetic decoder and a sequential decoder; and*

*producing output data using the decoder,*

*wherein the arithmetic decoder, upon detecting an absence of an expected encoded reserved symbol or a presence of an unexpected encoded reserved symbol, initiates an error correction routine,*

*wherein the arithmetic decoder does not initiate the error correction routine upon detection of an allowed symbol in the received data, and*

*wherein the sequential decoder, upon initiation of the error correction routine by the arithmetic decoder, changes at least one bistable element in the sequential decoder or selects a series of sequential bits from a plurality of series of sequential bits which result from the changing of bistable elements in the sequential decoder.*

*26. The method of claim 25, further comprising:*

*receiving coded data from the encoder at a modulator, which outputs modulated data to the channel.*

*27. The method of claim 25, wherein the received data is a signal corresponding to a binary bit stream sequence of "1"/("0")'s and "0"/("1")'s.*

*28. The method of claim 27, wherein the producing output data further comprises making hard logic circuitry decisions as to a presence of the "1"/("0")'s and "0"/("1")'s based on the signal.*

*29. The method of claim 28, wherein the producing output data further comprises using the sequential decoder to monitor output from the arithmetic decoder for errors.*

*30. The method of claim 29, wherein the producing output data further comprises:*

*identifying a branch point if the signal has a value located within a null zone; and*

*correcting the "1"/("0") or "0"/("1") binary bit by inverting it to "0"/("1") or "1"/("0") respectively, at the sequential decoder if an output from the arithmetic decoder indicates an error.*

*31. The method of claim 30, wherein the identifying a branch point and the correcting the "1"/("0") or "0"/("1") binary bit is performed more than once.*

*32. The method of claim 31, wherein the producing output data further comprises determining a number of branch points at which correction of the "1"/("0") or "0"/("1") binary bit has been performed (Kc).*

*33. The method of claim 32, wherein the producing output data further comprises:*

*decreasing a value of Kc by 1 if a subsequent branch point is sequentially prior to a first branch point; and*

*increasing the value of Kc by 1 if the subsequent branch point is not sequentially prior to the first branch point.*

*34. The method of claim 32, further comprising:*

*determining a Hamming distance threshold (Tc); and*

*expanding the null zone to increase a number of branch points, if the number of branch points at which correction has been performed (Kc) exceeds the Hamming distance threshold (Tc).*

*35. The method of claim 31, wherein the producing the output data further comprises:*

*determining a Euclidean distance between the received data and the output data; and*

*expanding the null zone to increase a number of branch points, if the Euclidean distance for subsequent calculations increases faster than a defined rate.*

*36. The method of claim 25, wherein the producing the output data further comprises:*

*selecting a series of sequential bits in the sequential decoder by,*

*eliminating any series of sequential bits which contains an encoded reserved symbol;*

*applying a metric to at least two series of sequential bits which do not contain an encoded reserved symbol and determining which series is most likely correct; or*

*applying an Euclidean metric to at least two series of sequential bits which do not contain an encoded reserved symbol and determining which series is most likely correct.*

*37. The method of claim 25, further comprising using the decoder in a communication system.*

*38. The method of claim 37, further comprising using Binary Phase Shift Keying (BPSK), Quadrature Phase Shift Keying (QPSK), or Trellis Coded Modulation (TCM) in the communication system.*

*39. A system, comprising:*

*a decoder, comprising an encoded symbol decoder and a sequential decoder, configured to receive data from an arithmetic encoder via a channel,*

*wherein the encoded symbol decoder, upon detecting an absence of an expected encoded reserved symbol or a presence of an unexpected encoded reserved symbol, is configured to initiate an error correction routine,*

*wherein the encoded symbol decoder is configured to not initiate the error correction routine upon detection of an allowed symbol in the received data, and*

*wherein the sequential decoder is configured to, upon initiation of the error correction routine by the encoded symbol decoder, change at least one bistable element in the sequential decoder or select a series of sequential bits from a plurality of series of sequential bits which result from the changing of bistable elements in the sequential decoder.*

*40. The system of claim 39, wherein the encoded symbol decoder is an arithmetic decoder.*

*41. The system of claim 39, further comprising:*

*the arithmetic encoder configured to receive input data; and*

*a modulator located between the encoder and the channel.*

*42. The system of claim 39, wherein the decoder is configured for use in a communication system.*

*43. The system of claim 39, wherein the communication system is configured to use Binary Phase Shift Keying (BPSK), Quadrature Phase Shift Keying (QPSK), or Trellis Coded Modulation (TCM).*

*44. A method, comprising:*

*receiving data from an encoder via a channel at a decoder, comprising an encoded symbol decoder and a sequential decoder; and*

*producing output data using the decoder,*

*wherein the encoded symbol decoder, upon detecting an absence of an expected encoded reserved symbol or a presence of an unexpected encoded reserved symbol, initiates an error correction routine,*

*wherein the encoded symbol decoder does not initiate the error correction routine upon detection of an allowed symbol in the received data, and*

*wherein the sequential decoder, upon initiation of the error correction routine by the encoded symbol decoder, changes at least one bistable element in the sequential decoder or selects a series of sequential bits from a plurality of series of sequential bits which result from the changing of bistable elements in the sequential decoder.*

*45. The method of claim 44, further comprising:*

*receiving the data from the encoder via a modulator, which outputs data to the channel.*

*46. The method of claim 44, further comprising using an arithmetic encoder as the encoder and an arithmetic decoder as the encoded symbol decoder.*

*47. The method of claim 44, further comprising using a signal corresponding to a binary bit stream sequence of "1"/("0")'s and "0"/("1")'s as the received data.*

*48. The method of claim 47, wherein the producing output data further comprises making hard logic circuitry decisions as to a presence of the "1"/("0")'s and "0"/("1")'s based on the signal.*

*49. The method of claim 48, wherein the producing output data further comprises using the sequential decoder to monitor output from the encoded symbol decoder for errors.*

*50. The method of claim 49, wherein the producing output data further comprises:*

*identifying a branch point if the signal has a value located within a null zone; and*

*correcting the "1"/("0") or "0"/("1") binary bit by inverting it to "0"/("1") or "1"/("0") respectively, in the sequential decoder if an output from the encoded symbol decoder indicates an error.*

*51. The method of claim 50, wherein the identifying a branch point and the correcting the "1"/("0") or "0"/("1") binary bit is performed more than once.*

*52. The method of claim 51, wherein the producing output data further comprises determining a number of branch points at which correction of the "1"/("0") or "0"/("1") binary bit has been performed (Kc).*

*53. The method of claim 52, wherein the producing output data further comprises:*

*decreasing a value of Kc by 1 if a subsequent branch point is sequentially prior to a first branch point; and*

*increasing the value of Kc by 1 if the subsequent branch point is not sequentially prior to the first branch point.*

*54. The method of claim 52, further comprising:*

*determining a Hamming distance threshold (Tc); and*

*expanding the null zone to increase a number of branch points, if the number of branch points at which correction has been performed (Kc) exceeds the Hamming distance threshold (Tc).*

*55. The method of claim 51, wherein the producing output data further comprises:*

*determining a Euclidean distance between the received data and the output data; and*

*expanding the null zone to increase a number of branch points, if the Euclidean distance for subsequent calculations increases faster than a defined rate.*

*56. The method of claim 51, wherein the producing the output data further comprises:*

*selecting a series of sequential bits in the sequential decoder by,*

*eliminating any series of sequential bits which contains an encoded reserved symbol;*

*applying a metric to at least two series of sequential bits which do not contain an encoded reserved symbol and determining which series is most likely correct; or*

*applying an Euclidean metric to at least two series of sequential bits which do not contain an encoded reserved symbol and determining which series is most likely correct.*

*57. The method of claim 44, further comprising using the decoder in a communication system.*

*58. The method of claim 57, further comprising using Binary Phase Shift Keying (BPSK), Quadrature Phase Shift Keying (QPSK), or Trellis Coded Modulation (TCM) in the communication system.*

* * * * *

UNITED STATES PATENT AND TRADEMARK OFFICE

CERTIFICATE OF CORRECTION

PATENT NO. : RE43,231 E
APPLICATION NO. : 11/798175
DATED : March 6, 2012
INVENTOR(S) : Sayood et al.

It is certified that error appears in the above-identified patent and that said Letters Patent is hereby corrected as shown below:

On the Title page, item (56), under "Foreign Patent Documents", Line 1, delete "9/1988" and insert --9/1998--.

Page 2, item (56), under "Other Publications", Line 22, delete "Sequency" and insert --Sequence--.

Column 1, line 17, delete "*U.SC.*" and insert --*U.S.C.*--.

Column 21, lines 16-17, in Claim 1, delete "detecting of the presence of an unexpected encoded reserved symbol a selection from the group consisting of:" and insert --detecting of the presence of an unexpected encoded reserved symbol, *perform* a selection from the group consisting of:--.

Column 22, line 39, in Claim 3, delete "of aplurality" and insert --of a plurality--.

Column 23, line 48, in Claim 7, delete "therein to;" and insert --thereinto;--.

Column 24, line 18, in Claim 8, delete "means; an" and insert --means; and--.

Column 25, line 48, in Claim 9, delete "th place" and insert --the place--.

Column 29, line 2, in Claim 15, delete " $+\underline{x}\sqrt{E_s}$ and $-\underline{x}\sqrt{E_s}$ " and insert -- $+\underline{x}\sqrt{E_s}$ and $-\underline{x}\sqrt{E_s}$ --.

Column 29, line 39, in Claim 18, delete "method of further" and insert --method further--.

Column 29, line 56, in Claim 19, delete "he magnitude" and insert --the magnitude--.

Signed and Sealed this
Twenty-fifth Day of September, 2012

David J. Kappos

David J. Kappos
*Director of the United States Patent and Trademark Office*

Column 29, line 65, in Claim 20, delete “deocding” and insert --decoding--.

Column 33, line 3, in Claim 43, delete “*claim 39*,” and insert --*claim 42*,--.